(12) United States Patent
Yang et al.

(10) Patent No.: US 9,721,662 B1
(45) Date of Patent: Aug. 1, 2017

(54) NON-VOLATILE MEMORY WITH EFFICIENT PROGRAMMING

(71) Applicant: SANDISK TECHNOLOGIES INC., Plano, TX (US)

(72) Inventors: Nian Niles Yang, Mountain View, CA (US); Chris Avila, Saratoga, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/994,525

(22) Filed: Jan. 13, 2016

(51) Int. Cl.
*G11C 16/04* (2006.01)
*G11C 16/10* (2006.01)
*G11C 16/34* (2006.01)
*G11C 16/26* (2006.01)

(52) U.S. Cl.
CPC .......... *G11C 16/0483* (2013.01); *G11C 16/10* (2013.01); *G11C 16/26* (2013.01); *G11C 16/3418* (2013.01)

(58) Field of Classification Search
CPC ..... G11C 16/0483; G11C 16/10; G11C 16/26; G11C 16/3418
USPC .................................................. 365/185.17
See application file for complete search history.

(56) References Cited

U.S. PATENT DOCUMENTS

| | | | |
|---|---|---|---|
| 7,286,394 B2 | 10/2007 | Ooishi | |
| 7,420,242 B2* | 9/2008 | Lung | H01L 27/101 257/316 |
| 7,451,264 B2* | 11/2008 | Yero | G06F 12/0246 365/185.33 |
| 7,808,820 B2 | 10/2010 | Wong | |
| 8,027,209 B2 | 9/2011 | Yan | |
| 8,144,521 B2* | 3/2012 | Park | G11C 16/0483 365/185.17 |
| 8,199,579 B2* | 6/2012 | Shiino | G11C 11/5635 365/185.03 |
| 8,395,924 B2* | 3/2013 | Lee | G11C 8/14 365/148 |
| 8,570,793 B1 | 10/2013 | Yang | |
| 8,630,124 B2 | 1/2014 | Kim | |
| 8,634,249 B2* | 1/2014 | Yang | G11C 16/0441 365/185.16 |
| 8,837,216 B2 | 9/2014 | Mokhlesi | |
| 8,879,331 B2 | 11/2014 | Sel | |
| 8,902,659 B2 | 12/2014 | Chan | |
| 8,923,060 B2* | 12/2014 | Shim | G11C 16/30 365/185.17 |
| 9,053,766 B2* | 6/2015 | Yan | G11C 5/025 |
| 9,076,544 B2 | 7/2015 | Mokhlesi | |
| 9,165,656 B2 | 10/2015 | Dunga | |
| 9,223,692 B2* | 12/2015 | Kwak | G06F 12/0246 |

(Continued)

*Primary Examiner* — Pho M Luu

(74) *Attorney, Agent, or Firm* — Vierra Magen Marcus LLP

(57) ABSTRACT

A non-volatile memory system includes a plurality of NAND strings (or other arrangements) that form a monolithic three dimensional memory structure, bit lines, word lines, and one or more control circuits. Multiple NAND strings of the plurality of NAND strings have different select gates connected to different select lines. The multiple NAND strings are connected to a common bit line. The multiple NAND strings are connected to a common word line via their respective different select gates. The one or more control circuits concurrently program multiple memory cells on the multiple NAND strings.

21 Claims, 19 Drawing Sheets

(56) References Cited

U.S. PATENT DOCUMENTS 9,378,822 B2 * 6/2016 Kuo .................. G11C 16/3427
2014/0254268 A1 9/2014 Dunga

* cited by examiner

|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

Fig. 9
| Physical WL | Finger 0 | Finger 1 | Finger 2 | Finger 3 |
|---|---|---|---|---|
| WLL0 | 0 | 1 | 2 | 3 |
| WLL1 | 4 | 5 | 6 | 7 |
| WLL2 | 8 | 9 | 10 | 11 |
| WLL3 | 12 | 13 | 14 | 15 |
| WLL4 | 16 | 17 | 18 | 19 |
| WLL5 | 20 | 21 | 22 | 23 |
| WLL6 | 24 | 25 | 26 | 27 |
| ⋮ | | | | |
| WLL45 | 180 | 181 | 182 | 183 |
| WLL46 | 184 | 185 | 186 | 187 |
| WLL47 | 188 | 189 | 190 | 191 |
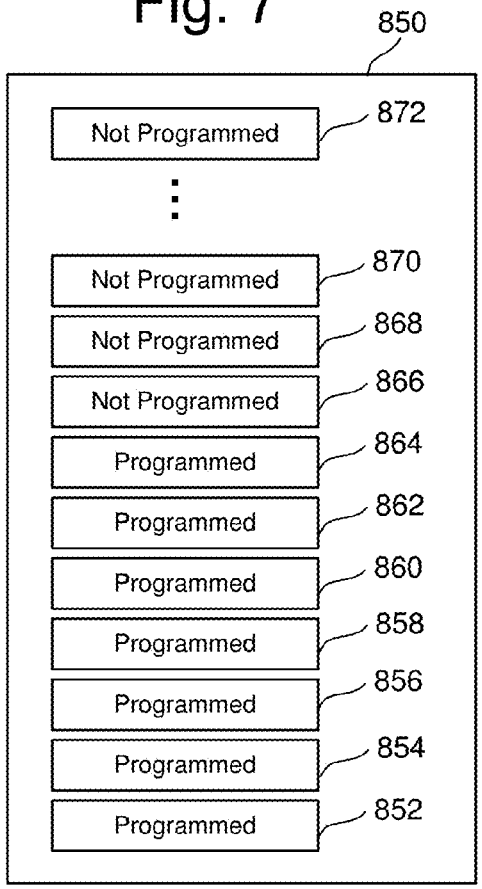
Fig. 7
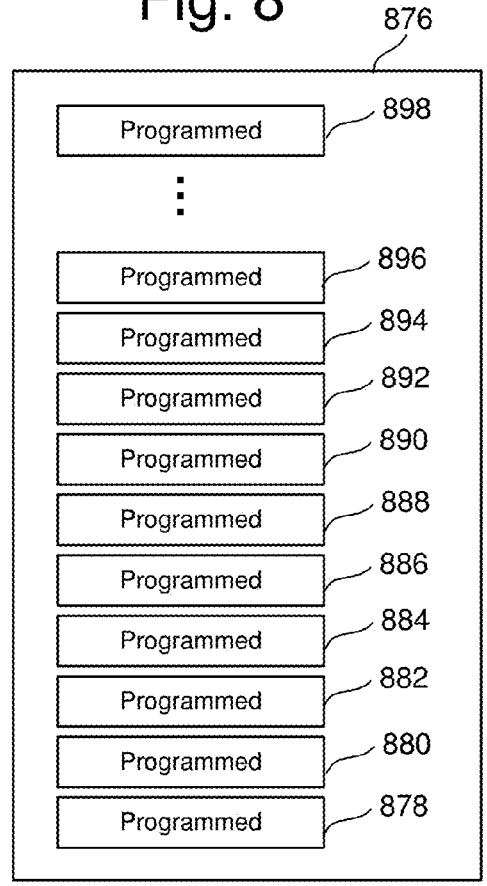
Fig. 8

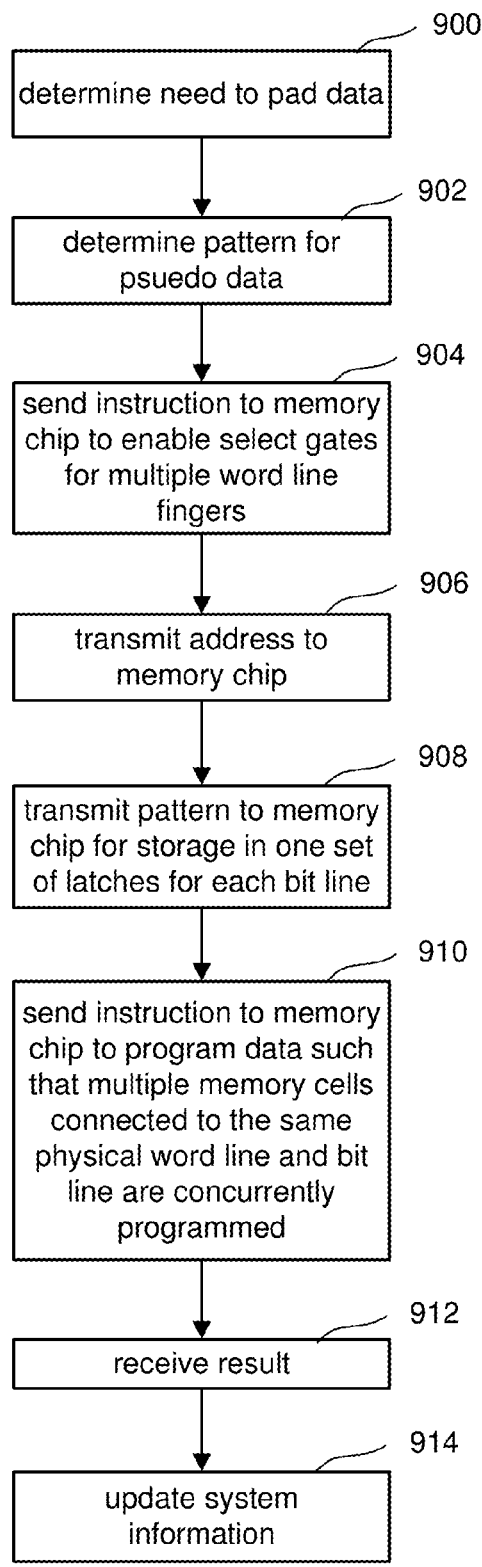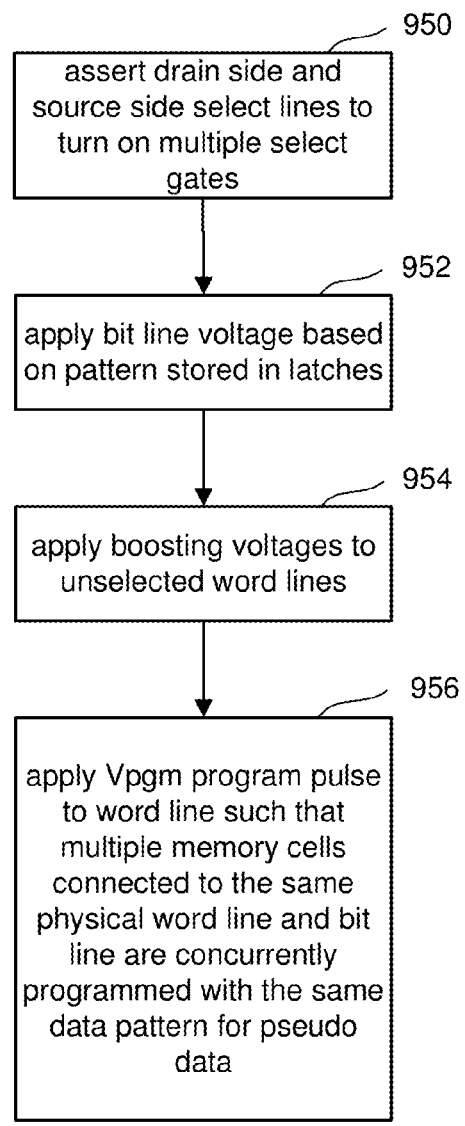

NON-VOLATILE MEMORY WITH EFFICIENT PROGRAMMING

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

A charge-trapping material can be used in non-volatile memory devices to store a charge which represents a data state. The charge-trapping material can be arranged vertically in a three-dimensional (3D) stacked memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer to create a vertical column of memory cells. Each memory cell can store one or more bits of data.

When a memory system is deployed in an electronic device, the memory system can be used to program data, read data and/or erase data.

BRIEF DESCRIPTION OF THE DRAWINGS

Like-numbered elements refer to common components in the different figures.

FIG. 7 depicts an open block.

FIG. 8 depicts a closed block.

FIG. 9 is a table describing the relationship between physical word lines and logical word lines.

FIG. 10 is a flow chart describing one embodiment of a process for programming.

FIG. 11 is a flow chart describing one embodiment of a process for applying a program pulse and other programming voltages.

DETAILED DESCRIPTION

To increase the speed of programming for certain programming operations, the memory system will simultaneously program a plurality of non-volatile memory cells connected to a common bit line and a common word line. One embodiment includes a bit line, a word line, multiple non-volatile memory cells connected to both the bit line and the word line, and one or more control circuits connected to the memory cells. The one or more control circuits are configured to concurrently program the multiple memory cells connected to both the bit line and the word line.

One example implementation includes a plurality of NAND strings (or other arrangements) that form a monolithic three dimensional memory structure, bit lines, word lines, and one or more control circuits. Multiple NAND strings of the plurality of NAND strings have different select gates connected to different select lines. The multiple NAND strings are connected to a common bit line. The multiple NAND strings are connected to a common word line via their respective different select gates. The one or more control circuits concurrently program multiple memory cells on the multiple NAND strings that are connected to the common bit line and the common word line.

The following discussion provides details of one example of a suitable structure for memory devices that can implement the proposed technology. Other structures can also be used to implement the proposed technology.

Figure 1:
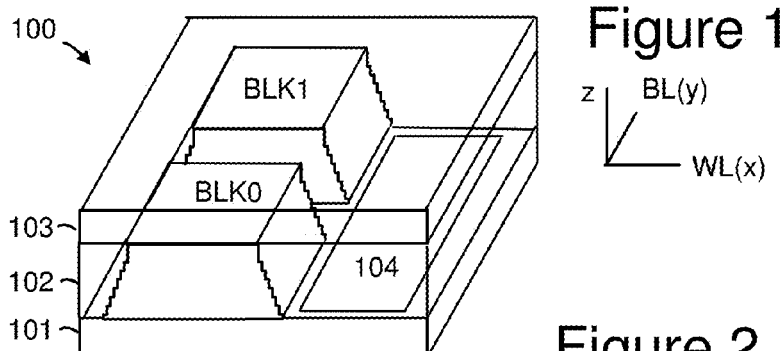
FIG. 1 is a perspective view of a 3D stacked non-volatile memory device.

FIG. 1 is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
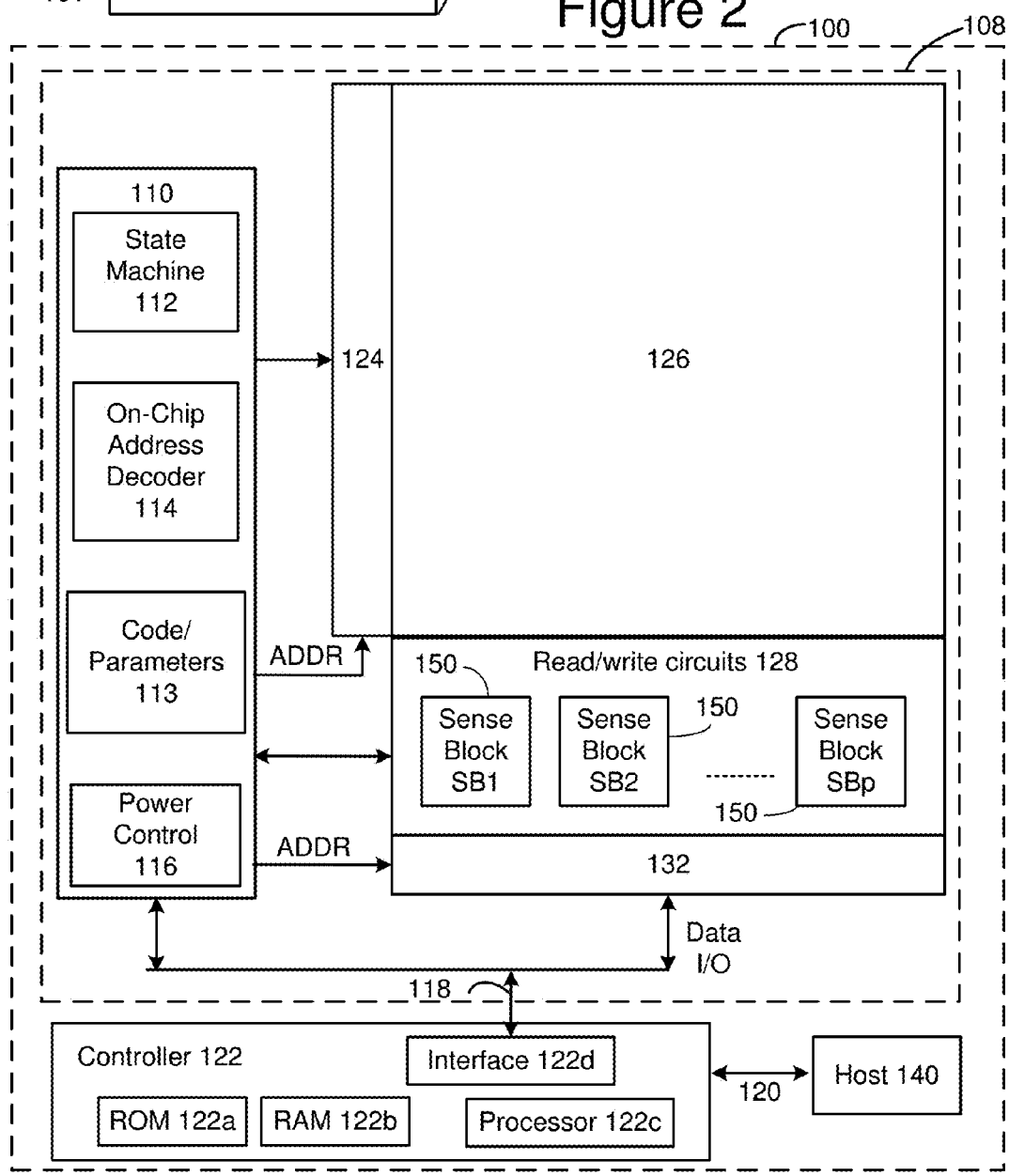
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three dimensional memory structure 126 of memory cells (such as, for example, a 3D array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells to be read or programmed in parallel. In some systems, a Controller 122 is included in the same memory device 100 (e.g., a removable storage card) as the one or more memory die 108. However, in other systems, the controller can be separated from the memory die 108. In some embodiments the controller will be on a different die than the memory die. In some embodiments, one Controller 122 will communicate with multiple memory die 108. In other embodiments, each memory die 108 has its own controller. Commands and data are transferred between the host 140 and Controller 122 via a data bus 120, and between Controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Code and parameter storage 113 may be provided for storing operational parameters and software. In one embodiment, state machine 112 is programmable by the software stored in code and parameter storage 113. In other embodiments, state machine 112 does not use software and is completely implemented in hardware (e.g., electrical circuits).

The on-chip address decoder 114 provides an address interface between addresses used by host 140 or memory Controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, code and parameter storage 113, power control module 116, sense blocks 150, read/write circuits 128, and Controller 122 can be considered one or more control circuits (or a managing circuit) that performs the functions described herein.

The (on-chip or off-chip) Controller 122 may comprise a processor 122c, ROM 122a, RAM 122b and a Memory Interface 122d, all of which are interconnected. Processor 122C is one example of a control circuit. Other embodiments can use state machines or other custom circuits designed to perform one or more functions. The storage devices (ROM 122a, RAM 122b) comprises code such as a set of instructions, and the processor 122c is operable to execute the set of instructions to provide the functionality described herein. Alternatively or additionally, processor 122c can access code from a storage device in the memory structure, such as a reserved area of memory cells connected to one or more word lines. Memory interface 122d, in communication with ROM 122a, RAM 122b and processor 122c, is an electrical circuit that provides an electrical interface between Controller 122 and memory die 108. For example, memory interface 122d can change the format or timing of signals, provide a buffer, isolate from surges, latch I/O, etc. Processor 122C can issue commands to control circuitry 110 (or any other component of memory die 108) via Memory Interface 122d.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 2A:
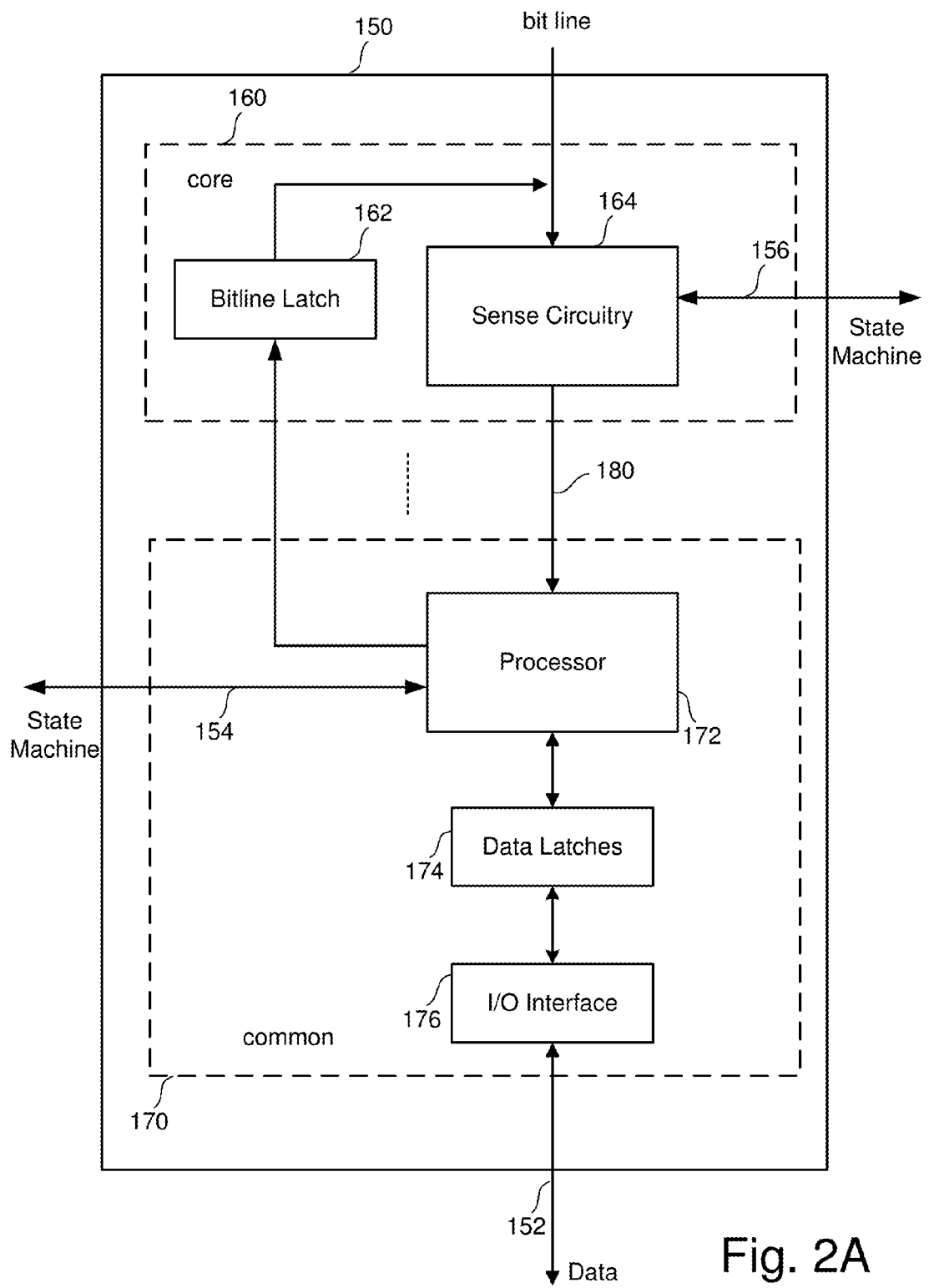
FIG. 2A is a block diagram that provides more details of a sense block.

FIG. 2A is a block diagram of an individual sense block 150 partitioned into a core portion, referred to as a sense module 160, and a common portion 170. In one embodiment, there will be a separate sense module 160 for each bit line and one common portion 170 for a set of multiple sense modules 160. In one example, a sense block will include one common portion 170 and eight sense modules 160. Each of the sense modules in a group will communicate with the associated common portion via a data bus 180. One example can be found in U.S. Patent Application Publication 2006/0140007, which is incorporated herein by reference in its entirety.

Sense module 160 comprises sense circuitry 164 that determines whether a conduction current in a connected bit line is above or below a predetermined level. In some embodiments, sense module 160 includes a circuit commonly referred to as a sense amplifier. Sense module 160 also includes a bit line latch 162 that is used to set a voltage condition on the connected bit line. For example, a predetermined state latched in bit line latch 162 will result in the connected bit line being pulled to a state designating program inhibit (e.g., Vdd) in order to lock out memory cells from programming.

Common portion 170 comprises a processor 172, a set of data latches 174 and an I/O Interface 176 coupled between the set of data latches 174 and data bus 152. Processor 172 performs computations. For example, one of its functions is to determine the data stored in the sensed memory cell and store the determined data in the set of data latches. The set of data latches 174 is used to store data bits determined by processor 172 during a read operation. It is also used to store data bits imported from the data bus 152 during a program operation. The imported data bits represent write data meant to be programmed into the memory. In one embodiment, the data latches include three bits per bit line; however, other embodiments can include more or less than three bits per bit line. I/O interface 176 provides an interface between data latches 174 and the data bus 152.

During read or sensing, the operation of the system is under the control of state machine 112 that controls (using power control 116) the supply of different control gate voltages to the addressed memory cell(s). As it steps through the various predefined control gate voltages corresponding to the various memory states supported by the memory, the sense module 160 may trip at one of these voltages and an output will be provided from sense module 160 to processor 172 via bus 180. At that point, processor 172 determines the resultant memory state by consideration of the tripping event(s) of the sense module and the information about the applied control gate voltage from the state machine via input lines 154. It then computes a binary encoding for the memory state and stores the resultant data bits into data latches 174. In another embodiment of the core portion 160, bit line latch 162 serves double duty, both as a latch for latching the output of the sense module 160 and also as a bit line latch as described above.

It is anticipated that some implementations will include multiple processors 172. In one embodiment, each processor 172 will include an output line (not depicted in FIG. 2A) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 172 to accumulate the results of the associated bit lines such that the state machine need only read the wired-OR line one time.

Data latch stack 174 contains a stack of data latches corresponding to the sense module. In one embodiment, there are three (or four or another number) data latches per sense module 160.

During program or verify, the data to be programmed is stored in the set of data latches 174 from the data bus 152. During the verify process, Processor 172 monitors the verified memory state relative to the desired memory state. When the two are in agreement, processor 172 sets the bit line latch 162 so as to cause the bit line to be pulled to a state designating program inhibit. This inhibits the memory cell coupled to the bit line from further programming even if it is subjected to programming pulses on its control gate. In other embodiments processor 172 initially loads the bit line latch 162 and the sense circuitry sets it to an inhibit value during the verify process.

In some implementations (but not required), the data latches are implemented as a shift register so that the parallel data stored therein is converted to serial data for data bus 152, and vice versa. In one preferred embodiment, all the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the sensing operations and sense amplifiers can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; (4) U.S. Patent Publication 2006/0221692, titled "Compensating for Coupling During Read Operations of Non-Volatile Memory," Inventor Jian Chen, filed on Apr. 5, 2005; and (5) U.S. Patent Application Publication No. 2006/0158947, titled "Reference Sense Amplifier For Non-Volatile Memory," Inventors Siu Lung Chan and Raul-Adrian Cernea, filed on Dec. 28, 2005.

Figure 3:
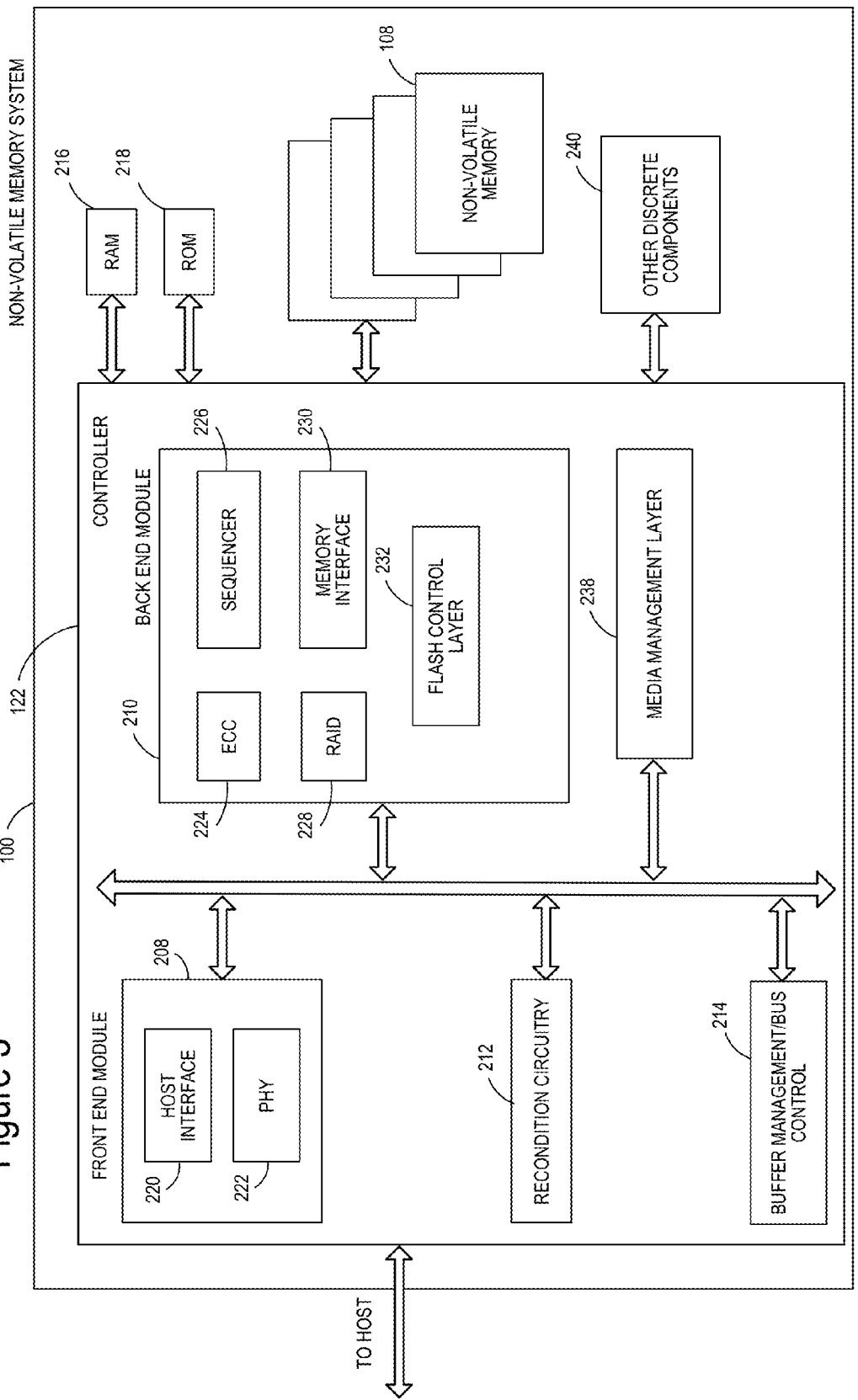
FIG. 3 is a block diagram depicting one embodiment of a controller.

FIG. 3 is a block diagram of example memory system 100, depicting more details of Controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between Controller 122 and non-volatile memory die 104 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host, such as in the form of a solid state disk (SSD) drive installed in a personal computer.

In some embodiments, non-volatile memory system 100 includes a single channel between Controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 3, controller 112 includes a front end module 208 that interfaces with a host, a back end module 210 that interfaces with the one or more non-volatile memory die 108, and various other modules that perform functions which will now be described in detail.

The components of Controller 122 depicted in FIG. 3 may take the form of a packaged functional hardware unit (e.g., an electrical circuit) designed for use with other components, a portion of a program code (e.g., software or firmware) executable by a (micro)processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for Controller 122 to perform the functions described herein. The architecture depicted in FIG. 3 is one example implementation that may (or may not) use the components of Controller 122 depicted in FIG. 2 (ie RAM, ROM, processor, interface).

Controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the Controller 122, a buffer manager/bus controller 214 manages buffers in random access memory (RAM) 216 and controls the internal bus arbitration of Controller 122. A read only memory (ROM) 218 stores system boot code. Although illustrated in FIG. 3 as located separately from the Controller 122, in other embodiments one or both of the RAM 216 and ROM 218 may be located within the controller. In yet other embodiments, portions of RAM and ROM may be located both within the Controller 122 and outside the controller. Further, in some implementations, the Controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction controller (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Drives) module 228 manages generation of RAID parity and recovery of failed data. The RAID parity may be used as an additional level of integrity protection for the data being written into the non-volatile memory system 100. In some cases, the RAID module 228 may be a part of the ECC engine 224. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of system 100 illustrated in FIG. 3 include media management layer 238, which performs wear leveling of memory cells of non-volatile memory die 108. System 100 also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of die 108. The MML 238 may be needed because: 1) the flash memory may have limited endurance; 2) the flash memory 126 may only be written in multiples of pages; and/or 3) the flash memory 126 may not be written unless it is erased as a block. The MML 238 understands these potential limitations of the flash memory 126 which may not be visible to the host. Accordingly, the MML 238 attempts to translate the writes from host into writes into the flash memory 126. As described below, erratic bits may be identified and recorded using the MML 238. This recording of erratic bits can be used for evaluating the health of blocks and/or word lines (the memory cells on the word lines).

Controller 122 may interface with one or more memory dies 108. In one embodiment, Controller 122 and multiple memory dies (together comprising non-volatile storage system 100) implement a solid state drive (SSD), which can emulate, replace or be used instead of a hard disk drive inside a host, as a NAS device, etc. Additionally, the SSD need not be made to work as a hard drive.

Figure 4:
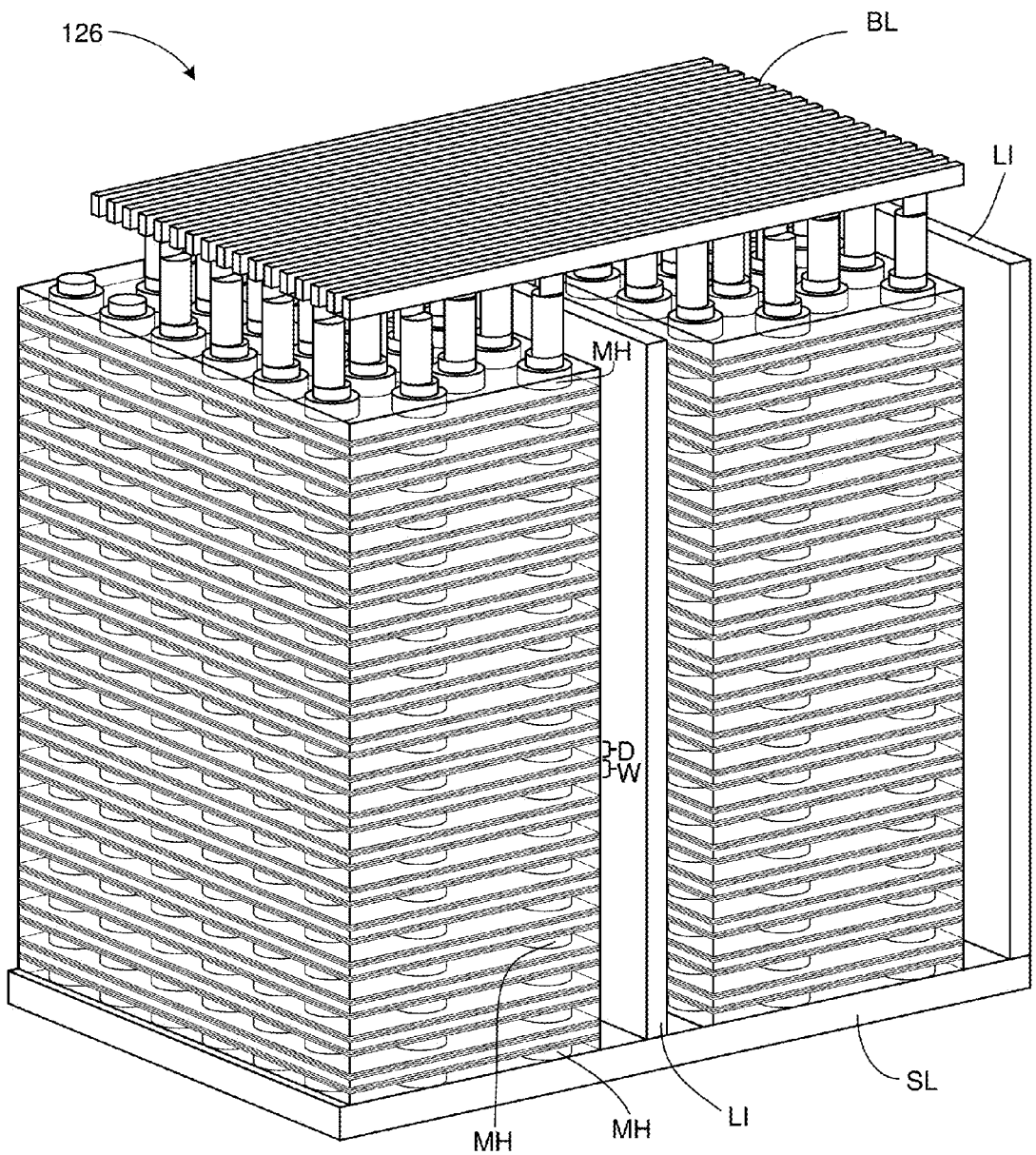
FIG. 4 is a perspective view of a portion of a three dimensional monolithic memory structure.

FIG. 4 is a perspective view of a portion of a three dimensional monolithic memory structure 126, which includes a plurality memory cells. For example, FIG. 4 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI. FIG. 4 only shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three dimensional monolithic memory structure 126 is provided below with respect to FIGS. 4A-4G.

Figure 4A:
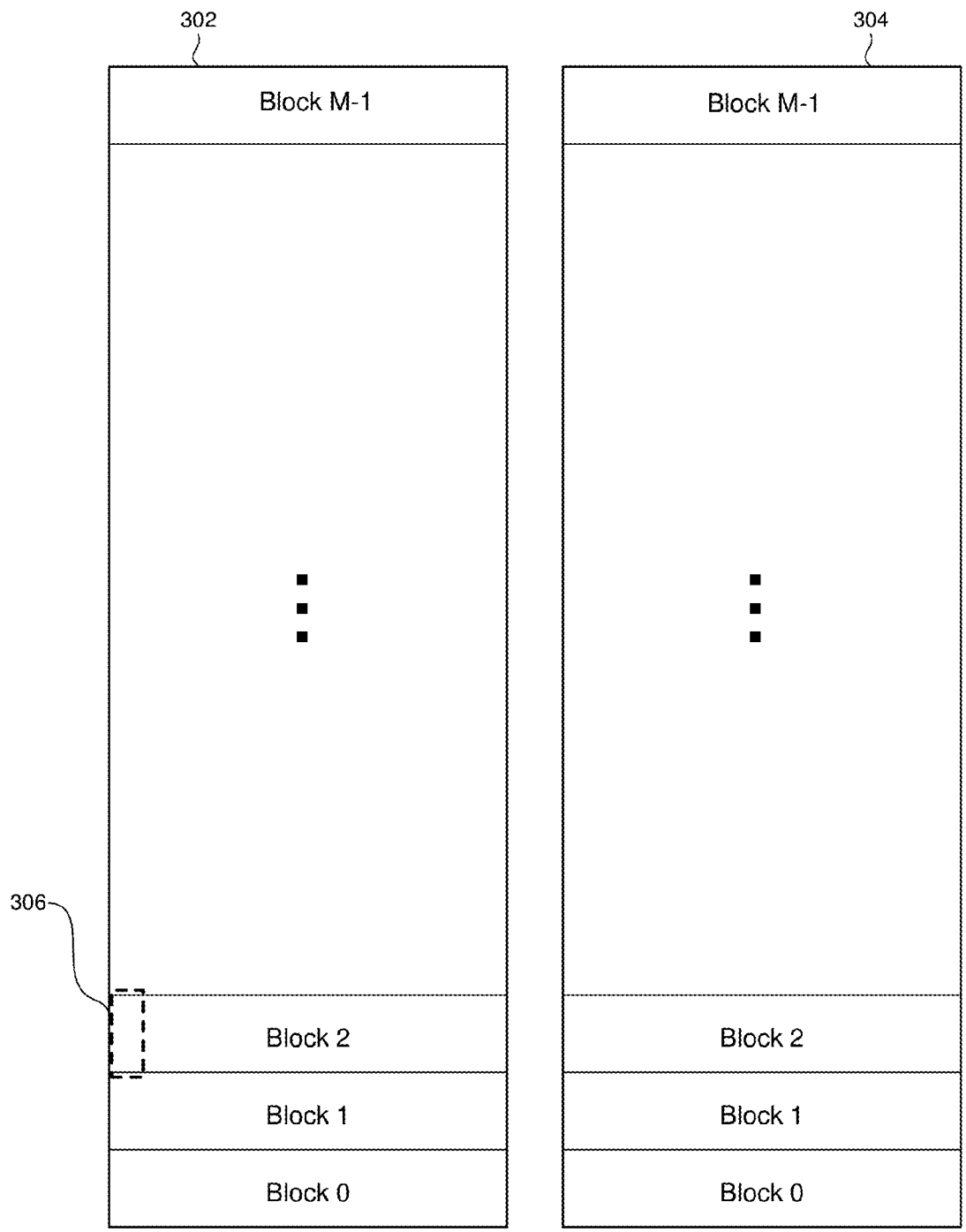
FIG. 4A is a block diagram of a memory structure having two planes.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . .

Figure 4B:
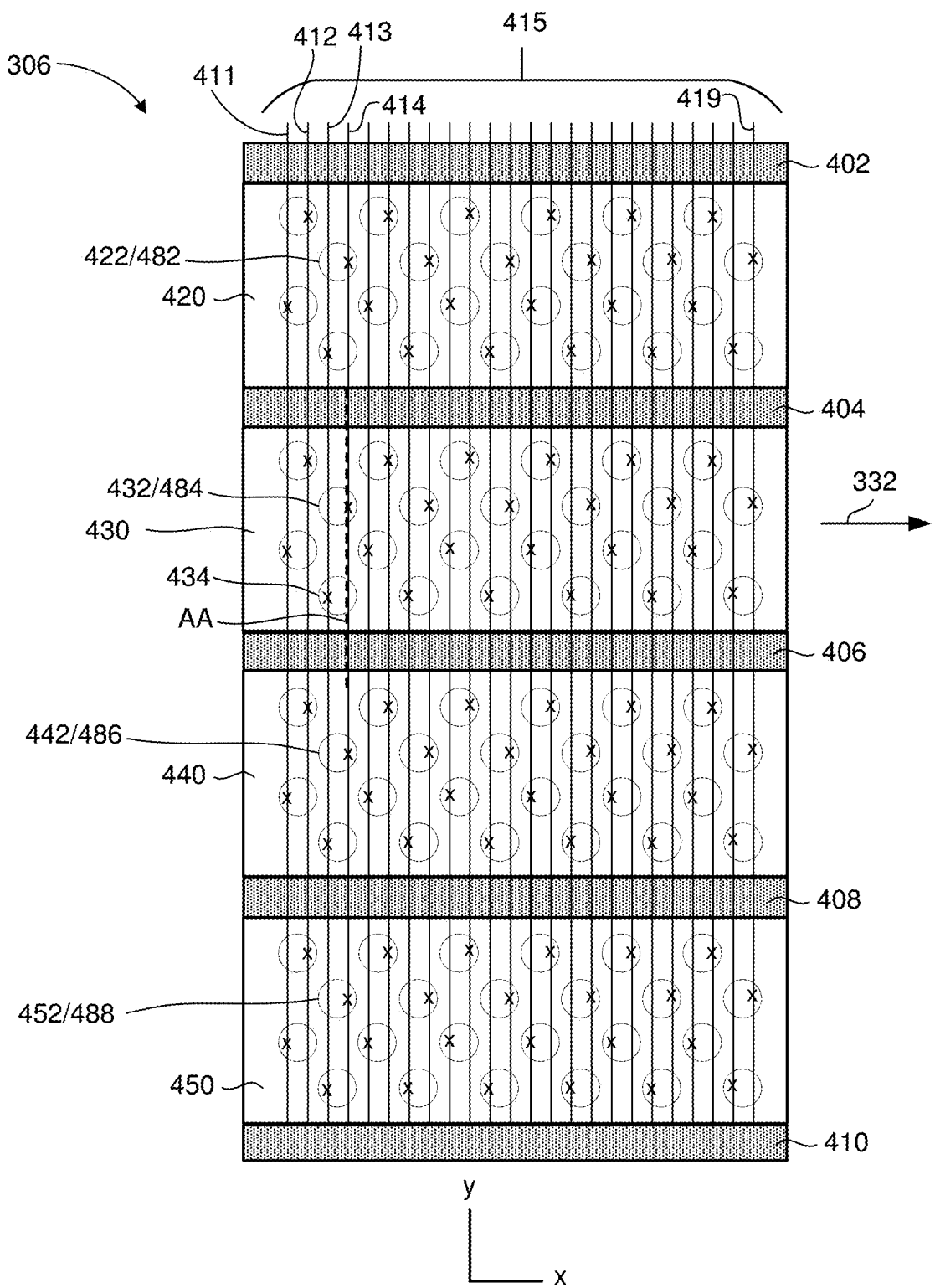
FIG. 4B depicts a top view of a portion of a block of memory cells.

FIGS. 4B-4E depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
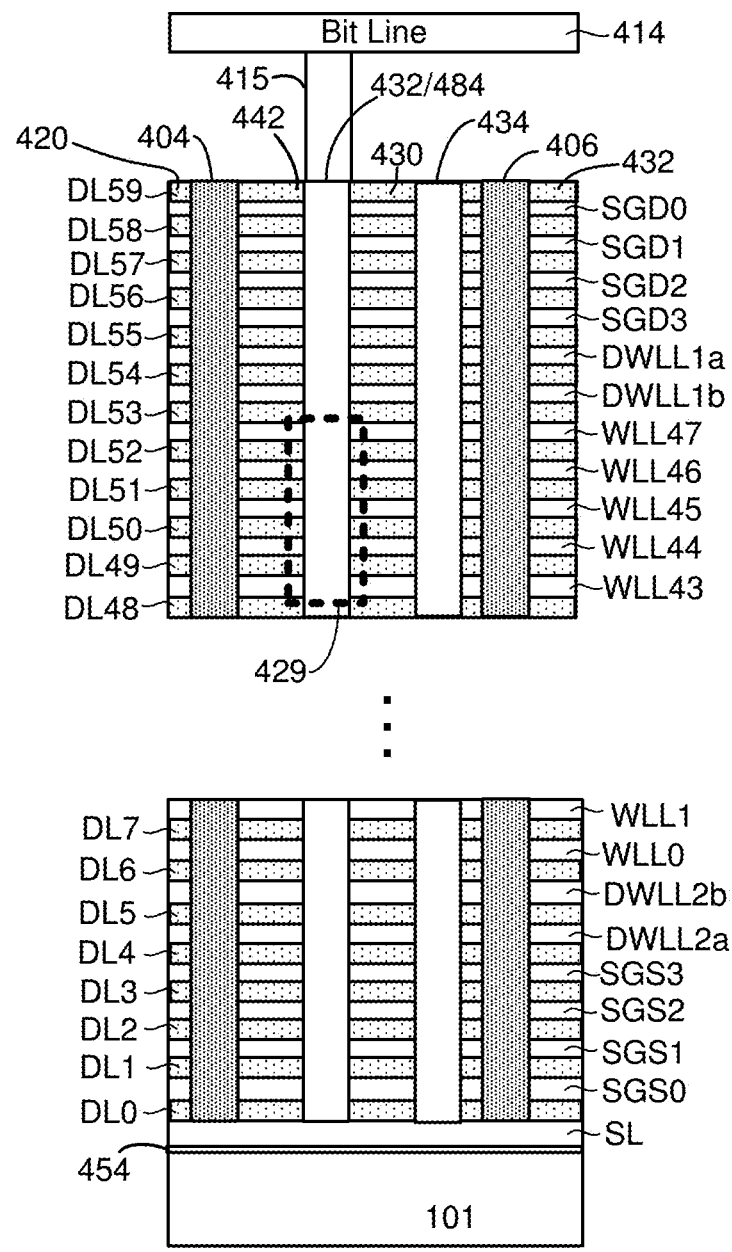
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; four dummy word line layers DWLL1a, DWLL1b, DWLL2a and DWLL2b; and forty eight data word line layers WLL0-WLL47 for connecting to data memory cells. Other embodiments can implement more or less than four drain side select layers, more or less than four source side select layers, more or less than four dummy word line layers, and more or less than forty eight word line layers (e.g., 96 word line layers). Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DWLL1a, DWLL1b, DWLL2a and DWLL2b; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DWLL1a, DWLL1b, DWLL2a and DWLL2b connect to dummy memory cells. A dummy memory cell does not store user data, while a data memory cell is eligible to store user data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

Figure 4D:
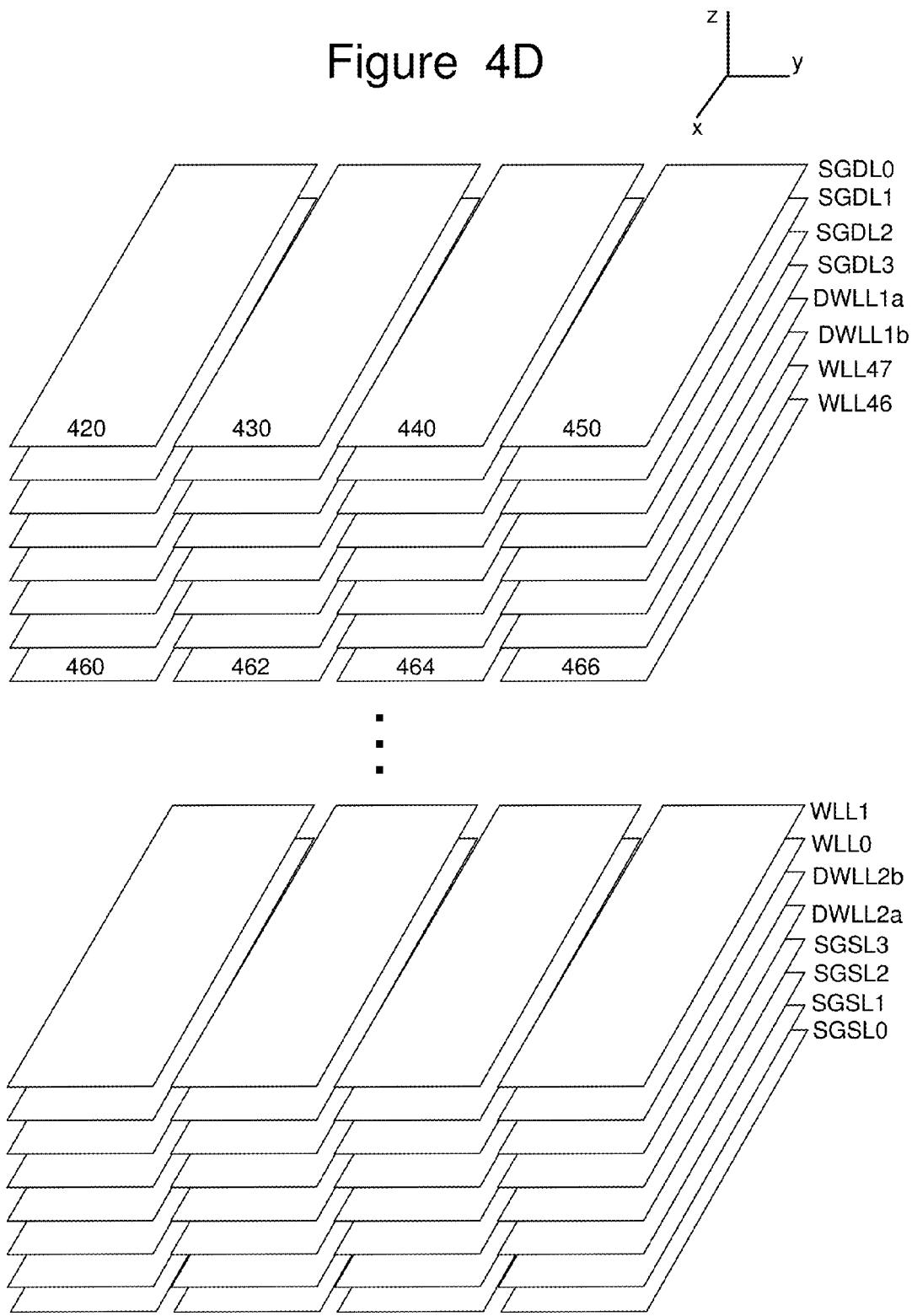
FIG. 4D depicts a view of the select gate layers and word line layers.

FIG. 4D depicts a logical representation of the conductive layers (SGD0, SGD1, SGD2, SGD3, SGS0, SGS1, SGS2, SGS3, DWLL1a, DWLL1b, DWLL2a, DWLL2b, and WLL0-WLL47) for the block that is partially depicted in FIG. 4C. As mentioned above with respect to FIG. 4B, in one embodiment local interconnects 402, 404, 406, 408 and 410 break up each conductive layers into four regions or fingers. For example, word line layer WLL31 is divided into regions 460, 462, 464 and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
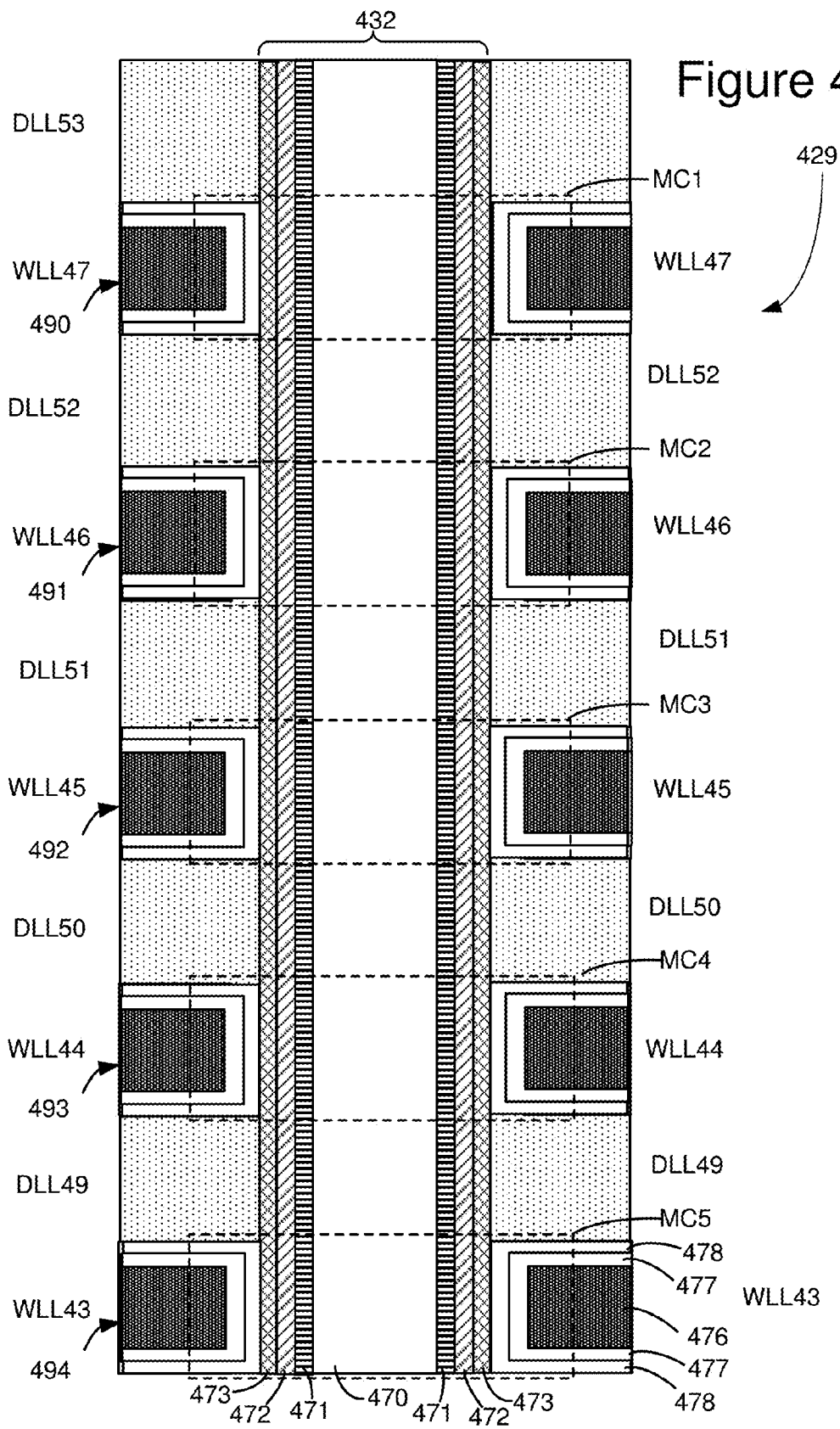
FIG. 4E is a cross sectional view of a vertical column of memory cells.

FIG. 4E depicts a cross sectional view of region 429 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
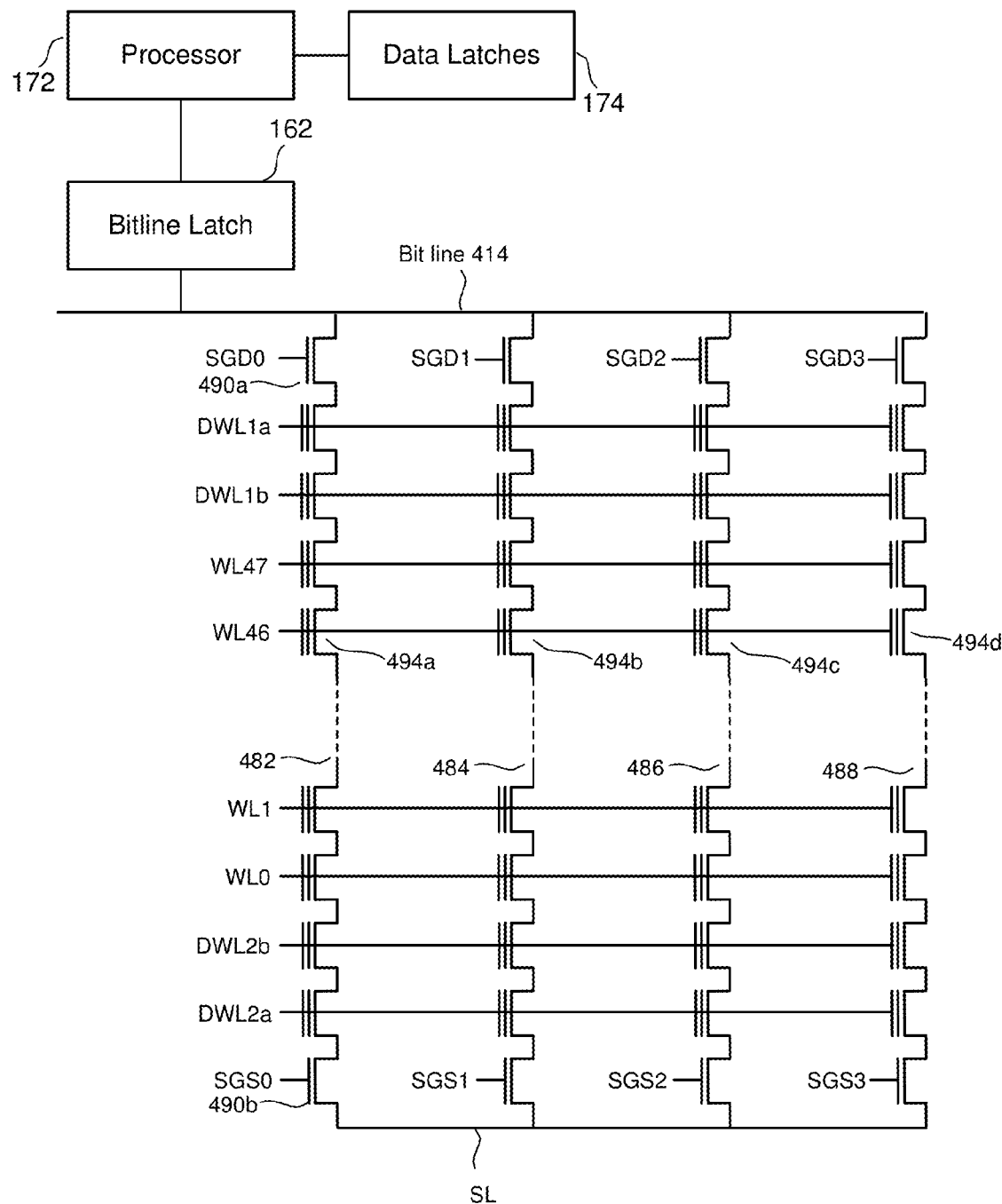
FIG. 4F is a schematic of a plurality of NAND strings.

FIG. 4F is a logical circuit diagram depicting a plurality of groups of connected programmable and erasable non-volatile memory cells arranged as four NAND strings 482, 484, 486 and 488 connected to a single bit line 414 and source line SL. The four NAND strings 482, 484, 486 and 488 are each in different word line fingers. The select lines SGD0, SGD1, SGD2, SGD3, SGS0, SGS1, SGS2, and SGS3 are used to select/unselect the depicted NAND strings. In one embodiment each drain side select line (SGD0, SGD1, SGD2, SGD3) connects to one of the four depicted NAND strings. For example, SGD0 is used to select NAND string 482 to connect NAND string 482 to bit line 414, SGD1 is used to select NAND string 484 to connect NAND string 484 to bit line 414, SGD2 is used to select NAND string 486 to connect NAND string 486 to bit line 414, SGD3 is used to select NAND string 488 to connect NAND string 488 to bit line 414. Similarly, each of the four drain side select lines (SGS0, SGS1, SGS2, SGS3) connect to one of the depicted NAND strings. For example, SGS0 is used to select NAND string 482 to connect NAND string 482 to common source line SL, SGS1 is used to select NAND string 484 to connect NAND string 484 to common source line SL, SGS2 is used to select NAND string 486 to connect NAND string 486 to common source line SL, SGS3 is used to select NAND string 488 to connect NAND string 488 to common source line SL. For example, to connect NAND string 482 to bit line 414, select gate 490b must be turned on (via select line SGD0) and to connect NAND string 482 to source line SL, select gate 490b must be turned on (via select line SGS0).

FIG. 4F also shows the bit line latch 162 connected to bit line 414. Bit line latch 162 communicates with (and connected to) data latches 174 via processor 172, as discussed above. In one embodiment that stores three bits of data per memory cell, there are three bits of the data latches 174 dedicated to each bit line. The combination of the bit line, the associated sense circuitry and the three bits of the data latches are shared by the four NAND strings 482, 484, 486 and 488. In prior systems, one of the four NAND strings 482, 484, 486 and 488 is connected to bit line 414 at a time by appropriately driving SGD0, SGD1, SGD2 and SGD3.

In some embodiments that store four bits of data per memory cell, there are four bits of the data latches 174 dedicated to each bit line. In some embodiments that store two bits of data per memory cell, there are two bits of the data latches 174 dedicated to each bit line. While some embodiments implement a number of bits of data latches 174 dedicated to a bit line as being equal to the number of bits of data per memory cell, other embodiments can have more or less bits of the data latches 174 dedicated to a bit line than the number of bits of data per memory cell.

FIG. 4F only shows four NAND strings. The three dimensional memory structure 126 includes more than four NAND strings. FIG. 4F is a logical circuit diagram that provides a sense of how multiple NAND strings are arranged as vertical NAND strings The structure of FIG. 4G corresponds to portion 306 in Block 2 of FIGS. 4A-F, including bit lines 411, 412, 413, 414, . . . 419. Within the block, each bit line connected to four NAND strings. SGD0, SGD1, SGD2 and SGD3 are used to determine which of the four NAND strings connect to the associated bit line.

Although the example memory system discussed above is a three dimensional memory structure that includes vertical NAND strings with charge-trapping material, other (2D and 3D) memory structures can also be used with the technology described herein. For example, floating gate memories (e.g., NAND-type and NOR-type flash memory ReRAM memories, magnetoresistive memory (e.g., MRAM), and phase change memory (e.g., PCRAM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

Figures 5, 5A:
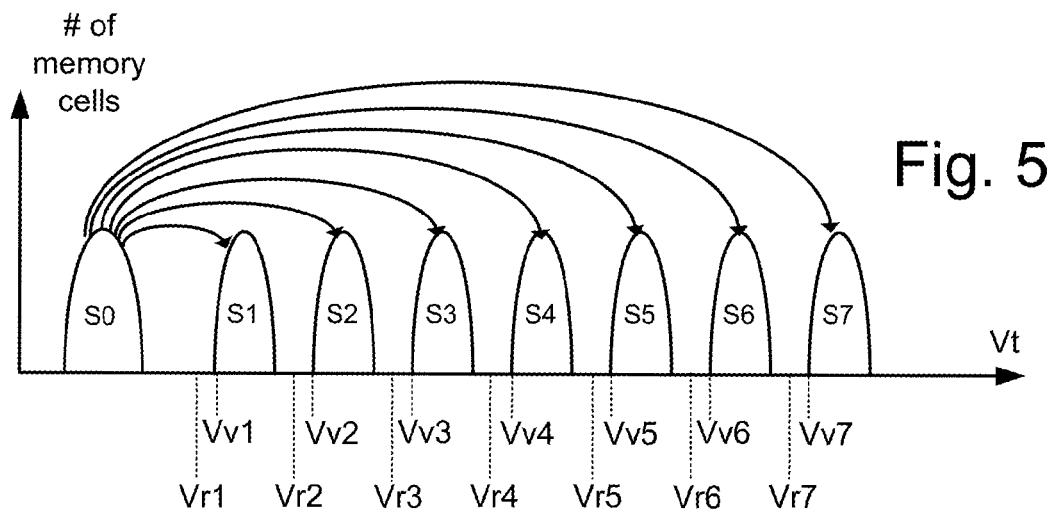
FIG. 5 depicts threshold voltage distributions.
FIG. 5A is a table describing one example of an assignment of data values to data states.

At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5 also shows seven read reference voltages, Vr1, Vr2, Vr3, Vr4, Vr5, Vr6, and Vr7, for reading data from memory cells. By testing whether the threshold voltage of a given memory cell is above or below the seven read reference voltages, the system can determine what data state (i.e., S0, S1, S2, S3, . . . ) the memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv4. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming (including, but not limited to, multiple stage/phase programming). In some embodiments, data states S1-D7 can overlap, with Controller 122 relying on ECC to identify the correct data being stored.

FIG. 5A is a table describing one example of an assignment of data values to data states. In the table of FIG. 5A, S0=111. S1=110, S2=200, S3=000, S4=010, S5=011, S6=001 and S7=101. Other encodings of data can also be used. No particular data encoding is required by the technology disclosed herein.

Figure 6A:
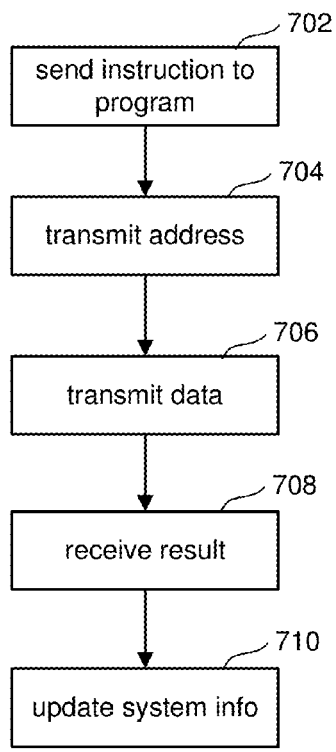
FIG. 6A is a flow chart describing one embodiment of a process for programming.

FIG. 6A is a flowchart describing one embodiment of a process for programming that is performed by Controller 122. In some embodiments, rather than have a dedicated controller, the host can perform the functions of the controller. In step 702, Controller 122 sends instructions to one or more memory die 108 to program data. In step 704, Controller 122 sends one or more logical addresses to one or more memory die 108. The one or more logical addresses indicate where to program the data. In step 706, Controller 122 sends the data to be programmed to the one or more memory die 108. In step 708, Controller 122 receives a result of the programming from the one or more memory die 108. Example results include that the data was programmed successfully, an indication that the programming operation failed, and indication that the data was programmed but at a different location, or other result. In step 710, in response to the result received in step 708, Controller 122 updates the system information that it maintains. In one embodiment, the system maintains tables of data that indicate status information for each block. This information may include a mapping of logical addresses to physical addresses, which blocks/word lines are open/closed (or partially opened/closed), which blocks/word lines are bad, etc.

In some embodiments, before step 702, Controller 122 would receive user data and an instruction to program from the host, and the controller would run the ECC engine to create code words from the user data. These code words are the data transmitted in step 706. Controller can also scramble the data to achieve wear leveling with respect to the memory cells.

Figure 6B:
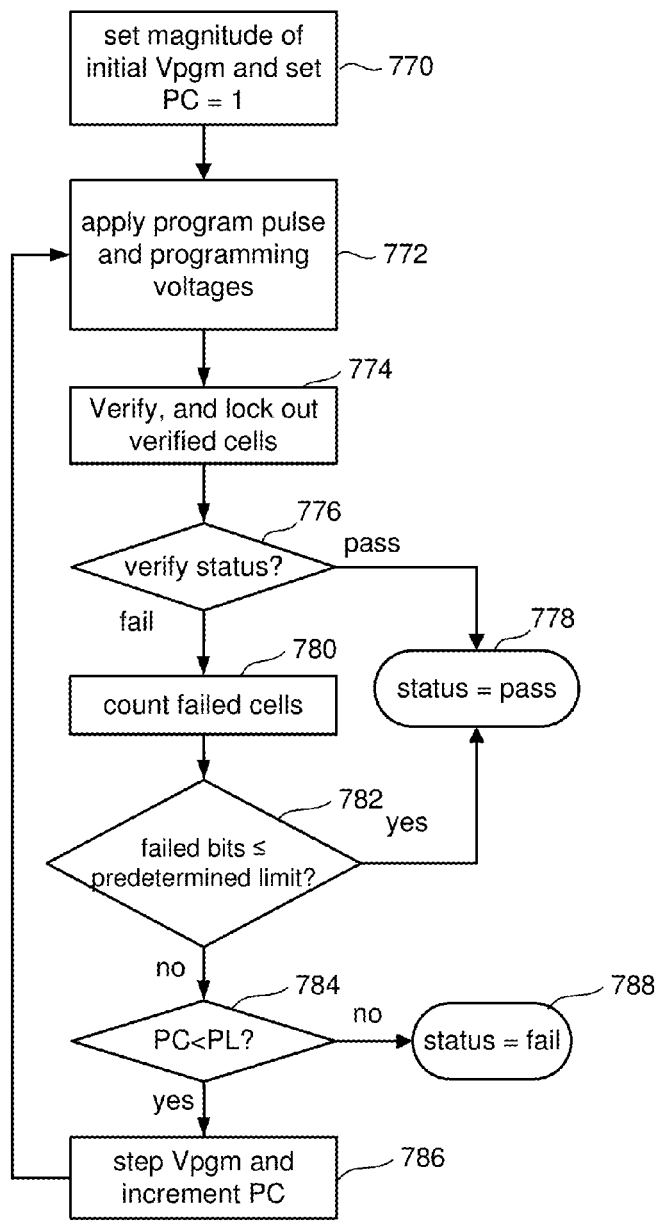
FIG. 6B is a flow chart describing one embodiment of a process for programming.

FIG. 6B is a flowchart describing one embodiment of a process for programming. The process of FIG. 6B is performed by the memory die in response to the steps of FIG. 6A (ie in response to the instructions, data and addresses from Controller 122). In one example embodiment, the process of FIG. 6B is performed on memory die 108 using the one or more control circuits discussed above, at the direction of state machine 112. The process of FIG. 6B can also be used to implement the full sequence programming discussed above. Additionally, the process of can be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 770 of FIG. 6B, the programming voltage (Vpgm) is initialized to the starting magnitude (e.g., ~12-16V or another suitable level) and a program counter PC maintained by state machine 112 is initialized at 1. In step 772, a program pulse of the program signal Vpgm is applied to the selected word line (the word line selected for programming) In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming In step 772, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 774, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 776, it is determined whether all the memory cells have reached their target threshold voltages (pass). If so, the programming process is complete and successful because all selected memory cells were programmed and verified to their target states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 20 and 30; however, other values can be used. If the program counter PC is not less than the program limit value PL, then the program process is considered to have failed and a status of FAIL is reported in step 788. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 786, the process loops back to step 772 and another program pulse is applied to the selected word line.

Sometimes when programming, the data does not fill up an entire block. Therefore, the block will have word lines that are not programmed That block is referred to as an open block. FIG. 7 depicts an open block of memory cells 850. Depicted in the block 850 are a set of physical word lines 852, 854, 856, 858, 860, 862, 864, 866, 868, 870 and 872. Each word line is depicted as a rectangle, representing the memory cells connected to that word line. Inside each rectangle is an indication of whether the memory cells have been subjected to programming (Programmed) or have not been programmed yet (Not Programmed). As can be seen, word lines 852-864 have been subjected to programming and those word lines are considered closed word lines. Word lines 866-872 have not been programmed; therefore, those word lines are open word lines. Block 850 is an open block because it has open word lines.

FIG. 8 depicts block 876 having word lines 878, 880, 882, 884, 886, 888, 890, 892, 894, 896 and 898. All of word lines 878-898 have received programming (Programmed); therefore, word lines 878-898 are all closed word lines and block 876 is a closed block. FIGS. 7 and 8 only show user data word lines.

FIGS. 4B-4G described a three dimensional memory array that includes vertical layers of charge trapping material in the memory holes that runs across multiple memory cells. For example, FIG. 4E shows charge trapping layer 473 passing through memory cells MC1, MC2, MC3, MC4, and MC5, without any physical barriers in charge trapping layer 473 between the memory cells. It has been discovered that in some instances electrons from the charge-trapping material of a programmed memory cell (e.g., on a closed word line) may migrate to a neighboring memory cell that is not programmed (e.g., on an open word line), which may lead to an error in the programmed data. In other words, electrons overtime move from where there is a high concentration of electrons to where there is a lower concentration of electrons. The issue can be exacerbated in high temperatures. This problem is a data retention issue.

To combat the above-described data retention issue, the memory system can pad the open word lines with pseudo data. Pseudo data is fake data, it is not data that the host instructed the memory system to store. The pseudo data could be copies of other data, random information, a predetermined sequence of information, a copy of real user data, etc. In one embodiment, the pseudo data used by the system is the data pattern "000" which corresponds to data state S3. In another embodiment, the pseudo data used by the system is the data pattern "110" which corresponds to data state S1. Other data patterns can also be used. In one set of implementations, all of the memory cells on all of the open word lines of an open block are programmed with the same pseudo data. In other implementations, different memory cells can be programmed with different pseudo data.

The pseudo data pattern "000" is best able to avoid the data retention issue, is immune to scrambling problems and easy to do ECC parity. The "000" data can be scrambled with 000 seed and having ECC parity of 000 so that after all the data manipulations, it can still be programmed to the strings of the NAND block as the "000" pattern.

By padding open word lines with pseudo data, there will be no open word line and, therefore, no neighboring memory cell that is not programmed that entices electrons to migrate.

Figure 4G:
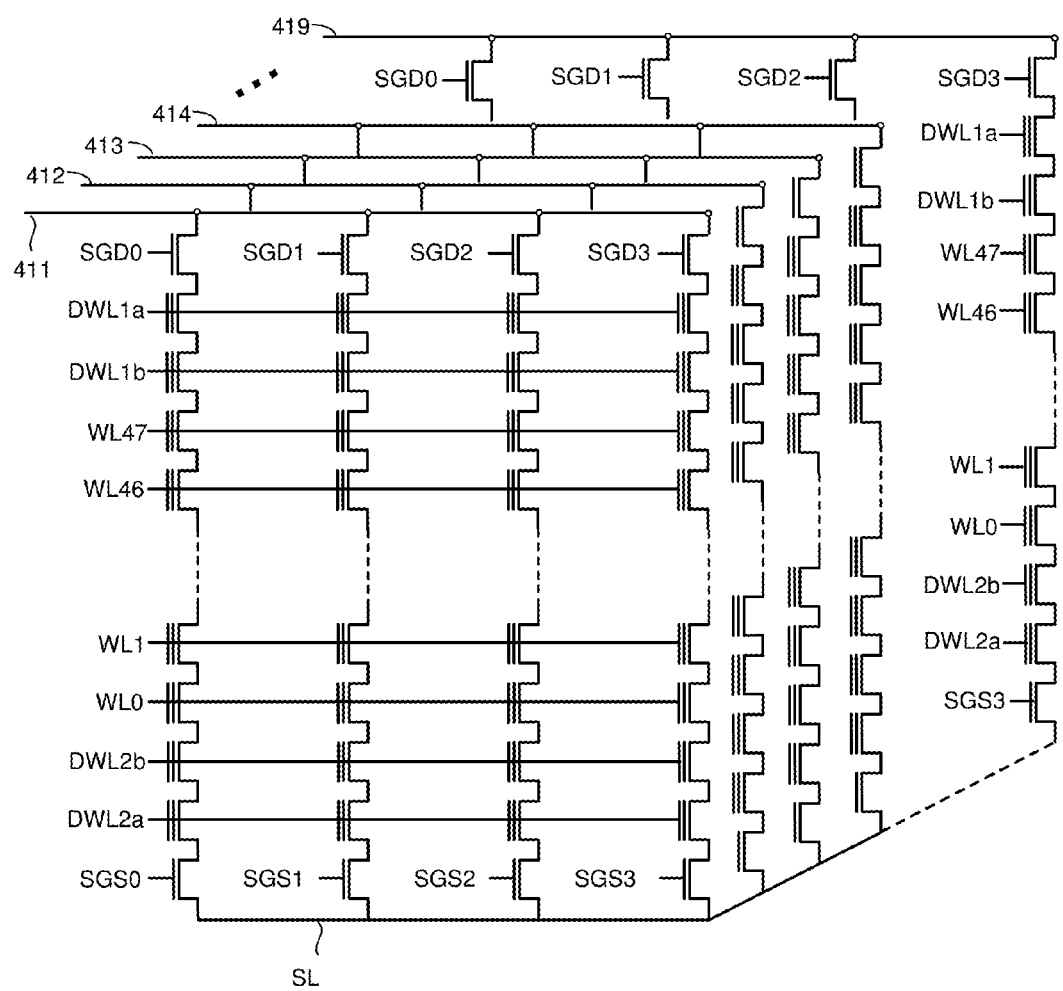
FIG. 4G is a schematic of a plurality of NAND strings.

Some embodiments make use of the concepts of physical word lines and logical word lines. Physical word lines are the actual physical structures (ie signal lines) that run across the entire block. This is depicted logically in FIGS. 7 and 8. Similarly, FIGS. 4F and 4G show physical word lines WLL0-WLL47 running across the entire block. In addition to physical word lines, the memory cells connected to a physical word line can be divided up into logical word lines based on the word line fingers discussed above. For example, FIG. 4D shows how each word line layer is divided into word line fingers (see discussion above). For example, word line layer WLL46 is divided into four word line fingers 460, 462, 464 and 466. Each of the word line fingers can be thought of as a logical word line that is connected to those memory cells passing through the word line finger. The select lines SGD0, SGD1, SGD2, SGD3, SGS0, SGS1, SGS2 and SGS3 are used to select logical word lines. For example, if WL46 (aka WLL46 of FIG. 4D) is the selected physical word line, then select lines SGD0, SGD1, SGD2, SGD3, SGS0, SGS1, SGS2 and SGS3 are used to select any one or more of logical word lines (also known as word line fingers) 460, 462, 464 and 466. The four logical word lines each connect to one of four NAND strings that are connected to the same bit line. Therefore, pasts systems program one logical word line at a time.

FIG. 9 is a table which shows one example of the relationship between physical word lines and logical word lines. The table only shows physical word lines WLL0, WLL1, WLL2, WLL3, WLL4, WLL5, WLL6, WLL45, ... WLL46 and WLL47 Each of the physical word lines depicted in FIG. 9 are broken up into four logical word lines, one logical word line for each of the four fingers (finger 0, finger 1, finger 2 and finger 3). Each of the logical word lines are labeled with a number 0-191, indicating the logical word line number. For example, physical word line WLL0 includes four logical word lines: 0, 1, 2 and 3. In some embodiments, the logical word lines are programmed in the order of the logical word line number.

FIG. 9 shows diagonal shading on logical word lines 0-19 to indicate that those logical word lines have already been programmed and, therefore. those logical word lines are closed logical word lines. Logical word lines 20-191 are not shaded in order to indicate that those logical word lines have not received programming and are open logical word lines. Therefore, the block depicted in FIG. 9 is an open block.

As discussed above, to avoid a data retention issue, open word lines can be padded with pseudo data. When programming the pseudo data, the logical word lines are programmed one logical word line at a time. In the example, of FIG. 9, since 172 logical word lines are programmed, the system would need to perform 172 programming processes to pad all of the open logical word lines. Performing 172 programming processes can be time consuming. Therefore, there is a need to speed up the padding of open logical word lines.

In one embodiment, since all of the memory cells of all of the open logical word lines will be receiving the same pseudo data, multiple or all logical word lines that are part of the same physical word line can be programmed at the same time. As discussed above, each bit line has only one set of latches for storing data to be programmed but each bit line is connected to four NAND strings (each connected to different logical word lines). So in the past, data for the first NAND string is loaded into the latches, the select lines are asserted to only select the first NAND string, and the memory cell on the first NAND string is programmed Subsequently, data for the second NAND string is loaded into the latches, the select lines are asserted to only select the second NAND string, and the memory cell on the second NAND string is programmed Subsequently, data for the third NAND string is loaded into the latches, the select lines are asserted to only select the third NAND string, and the memory cell on the third NAND string is programmed. Subsequently, data for the fourth NAND string is loaded into the latches, the select lines are asserted to only select the fourth NAND string, and the memory cell on the fourth NAND string is programmed.

When padding all four logical word lines connected to the same bit line with the same pseudo data, the pseudo data can be loaded into the latches, the select lines cam select all four NAND strings (ie select all four logical word lines) and concurrently program one memory cell from all four NAND strings based on the same data from the common latches connected to the common bit lines. For example, looking back at FIG. 4F, memory cells 494a, 494b, 494c and 494d are all connected to common bit line 414 and the same physical word line WL46. The select gates connected to the common bit line 414 are positioned between the bit line and the multiple memory cells, with each memory cell of the multiple memory cells being connected to and accessing the bit line via a different select gate. The one or more control circuits discussed above can assert (ie turn on) SGD0, SGD1, SGD2, SGD3, SGS0, SGS1, SGS2, and SGS3 so that all four logical word lines of physical word line WL46 are selected (and all four NAND strings 482, 484, 486 and 488) are selected. The one or more control circuits can then concurrently program memory cells 494a, 494b, 494c and 494d from the same data (e.g., pseudo data) from the same data latches 174 (one example of a data store). In some embodiments, less than all of the memory cells 494a, 494b, 494c and 494d can be concurrently programmed by only selecting less than all of the four select lines to select less than all of the logical word lines. In that case, other memory cells connected to the same word line and bit line can be programmed later with different data. The embodiments described above have four logical word lines for each physical word line; however, other embodiments can have less than four or more than four. Note that while the open word lines get padded with pseudo data, the closed word lines (before the padding) have already been programmed with real/user data.

In the above example, the multiple memory cells that are simultaneously programmed are connected to the same bit line and the same word line. The use of the label "bit line" and "word line" are for example purposes. Bit lines and word line are examples of control lines. The technology described herein can apply to other control lines, depending on the architecture of the memory structure.

FIGS. 10 and 11 are flow charts describing one embodiment for padding open logical word lines connected to the same physical word line. Specifically, the flow chart of FIG. 10 describes the process performed by Controller 122 to manage the programming process. The process of FIG. 10 can be performed once for each physical word line. In response to the process of FIG. 10, memory chip 108 will perform the process of FIG. 6B, with the process of FIG. 11 being the implementation of step 772 of FIG. 6B. In another example implementation, the state machine or another of the one or more control circuits can perform the process of FIG. 10. In one example, the one or more control circuits at the direction of the state machine will perform the process of FIGS. 6B and 11.

In step 900, Controller 122 determines that the system needs to pad data in a block. For example, if a block has been open for a long period of time, the controller may not want to program any new data into it because the data is old. That old data may have suffered from a data retention issue or can potentially suffer from a data retention issue in the future. Additionally, if data in an open block has been read many times, portions of the block may suffer from read disturb issues; therefore, Controller 122 does not want to program any further data into the block. Alternatively, Controller 122 may be performing maintenance on the memory system, including padding blocks that are open to prevent any issues from happening in the future. In step 902, Controller 122 determines a pattern for the pseudo data. In one example, as discussed above, the pattern for the pseudo data will be "000." In step 904, Controller 122 sends instruction to the memory chip 108 to enable multiple select gates for multiple word line fingers/logical word lines. While in past systems, instruction would only enable one select gate of the four select gates connected to logical word lines for the same physical word line, the process of FIG. 10 will allow Controller 122 (or another circuit) to send instructions to indicate two, three, four, etc. select gates to be enabled (including all select gates) for a common physical word line. In step 906, the Controller 122 sends an address to memory chip 108, which indicates the block and physical word line that is selected for programming In step 908, Controller 122 transmits the pattern for the pseudo data to memory chip 108 (e.g., via the memory interface 122*d* or 230). This pattern will be stored in one of the set of data latches 174. In one example, the pattern for the pseudo data is stored in the data latches for each bit line that is selected for programming In some embodiments, all the bit lines for a block will be selected for programming when padding pseudo data. In other embodiments, only a subset of bit lines will be selected for programming pseudo data. In step 910, Controller 122 sends instructions to memory chip 108 to program the data such that multiple memory cells (from the selected word line fingers e.g. all word line fingers) connected to the same physical word line and the same bit line are concurrently programmed In step 912, memory chip 108 will report its result and that result will be received by Controller 122. For example, the memory chip may report that the programming was performed successfully. Alternatively, an error code can be reported back. In step 914, Controller 122 will update any system information. For example, Controller 122 will include a table that correlates physical addresses in the memory to logical addresses for the data as well as indicating whether data was scrambled. Note that some memory systems will scramble data prior to programming In one embodiment, the pseudo data is not scrambles.

In response to the process of FIG. 10, memory chip 108 will perform the process of FIG. 6B. Step 772 of FIG. 6B includes applying a program pulse and other programming voltages. FIG. 11 is a flowchart describing more details of one embodiment of step 772 that are performed in response to Controller 122 performing the process of FIG. 10. In step 950, the system asserts the drain side select lines and the source side select lines to turn on the select gates for all four of the logical word lines for the same physical word line. For example, looking back at FIG. 4F, all eight of the select gates will be turned on by asserting SGD0, SGD1, SGD2, SGD3, SGS0, SGS1, SGS2 and SGS3 so that NAND strings 482, 484, 486 and 488 are all connected and in communication with bit line 414 and able to access the same data from data latches 174. In step 952, a bit line voltage is applied for each bit line based on the data pattern stored in the respective latches. In step 952, boosting voltages are applied to the unselected word lines, as discussed above. In step 956, the system applies the programming pulse (Vpgm) to the selected physical word line such that multiple memory cells connected to that same physical word line and the same bit line are concurrently programmed with the same data pattern for the pseudo data.

Looking back at FIG. 6B, step 774 includes verifying the programming. In one embodiment, the one or more control circuits are configured to verify the programming separately for each of the multiple memory cells connected to the same physical word line and the same bit line. In another embodiment, the one or more control circuits are configured to concurrently verify the programming for all (or a subset of) the multiple memory cells connected to the same physical word line and the same bit line that were programmed in step 956 of FIG. 11.

Figure 12:
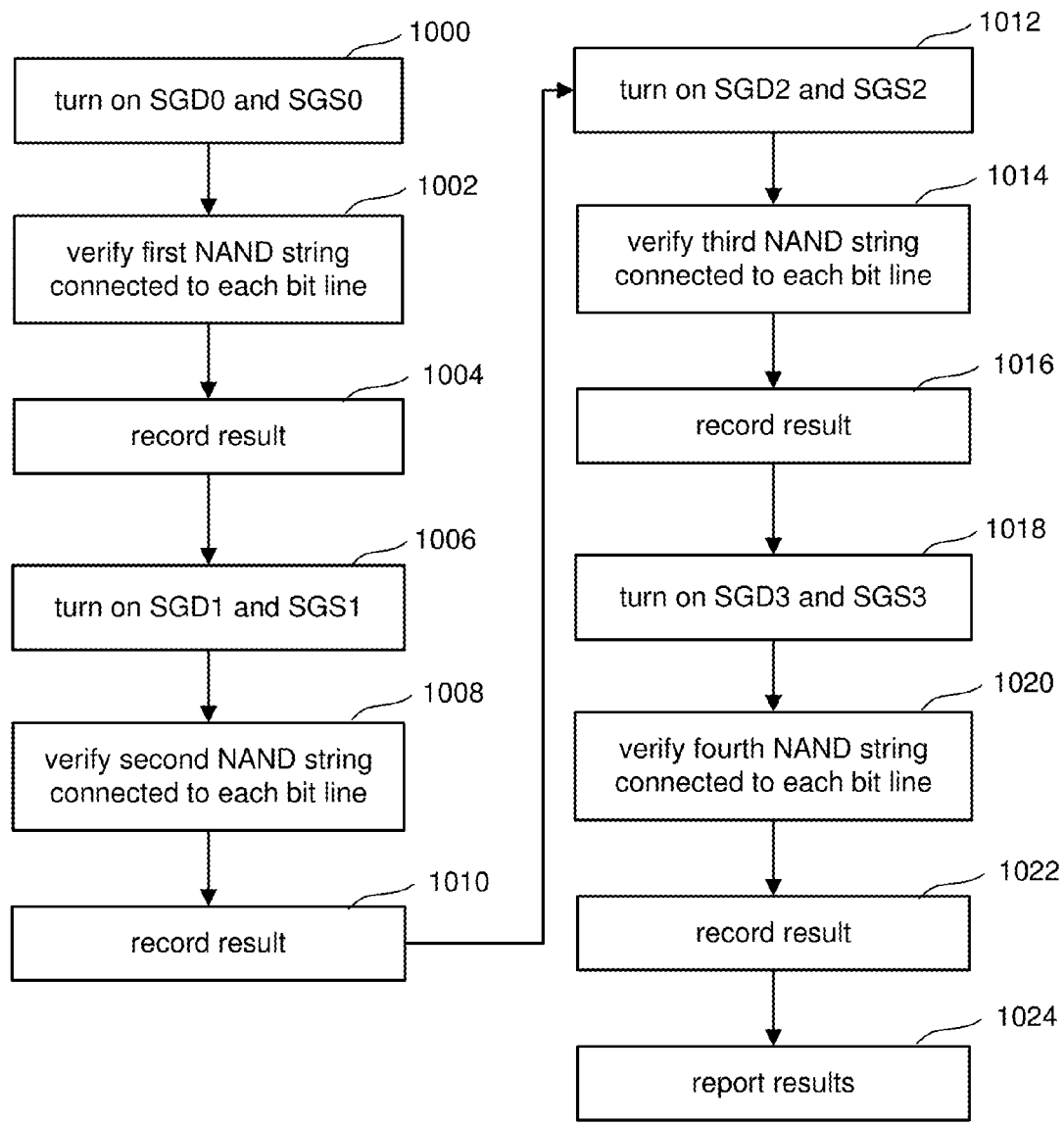
FIG. 12 is a flow chart describing one embodiment of a process for verifying programming.

FIG. 12 is a flowchart describing one embodiment of a process for verifying the programming separately for each of the multiple memory cells connected to the same physical word line and the same bit line. For example, looking back at FIG. 4F, memory cells 494*a*, 494*b*, 494*c* and 494*d* can be verified separately. In step 1000, the system turns on SGD0 and SGS0. That is, a logic one is applied on the signal lines SGD0 and SGS0 to turn on the select gates. The other select gates remain off. In some embodiments, the other source side select gates can remain on. In step 1002, the selected memory cells on the first NAND strings connected to each bit line is verified (e.g., by the processor 172 discussed above). For example, looking back at FIG. 4G, within a block, each bit line is connected to four NAND strings, with one of the NAND strings in each word line finger or logical word line. SGD0 is used to connect the first NAND string for each bit line, SGD1 is used to connect the second NAND string for each bit line, SGD2 is used to connect the third NAND string for each bit line and SGD3 is used to connect the fourth NAND string for each bit line. In step 1004, the result of the verification process of step 1002 (the memory cell on the first NAND string) is recorded.

In step 1006, SGD1 and SGS1 are turned on so that the second NAND string is connected to the bit line. The other select gates remain off. In step 1008, the memory cells being programmed on the second NAND string connected to each bit line are verified. In step 1010, the result of the verification in step 1008 is recorded (e.g., by the processor 172 discussed above). In step 1012, SGD2 and SGS2 are turned on with the other select lines remain off. This connects the third NAND string to each bit line. In step 1014, the memory cells selected for programming that are on the third NAND string connected to each bit line are verified using a verification process known in the art. In step 1016, the result of the verification in step 1014 is recorded. In step 1018, SGD3 and SGS3 are turned on with the other select lines remain off. This connects the fourth NAND string to each bit line. In step 1020, the memory cells selected for programming that are on the fourth NAND string connected to each bit line are verified using a verification process known in the art. In step 1022, the result of the verification in step 1020 is recorded. Thus, the process of FIG. 12 will separately verify the memory cells that are connected to the same bit line and word line. Note that memory cells connected to different bit lines are verified simultaneously.

Figure 13:
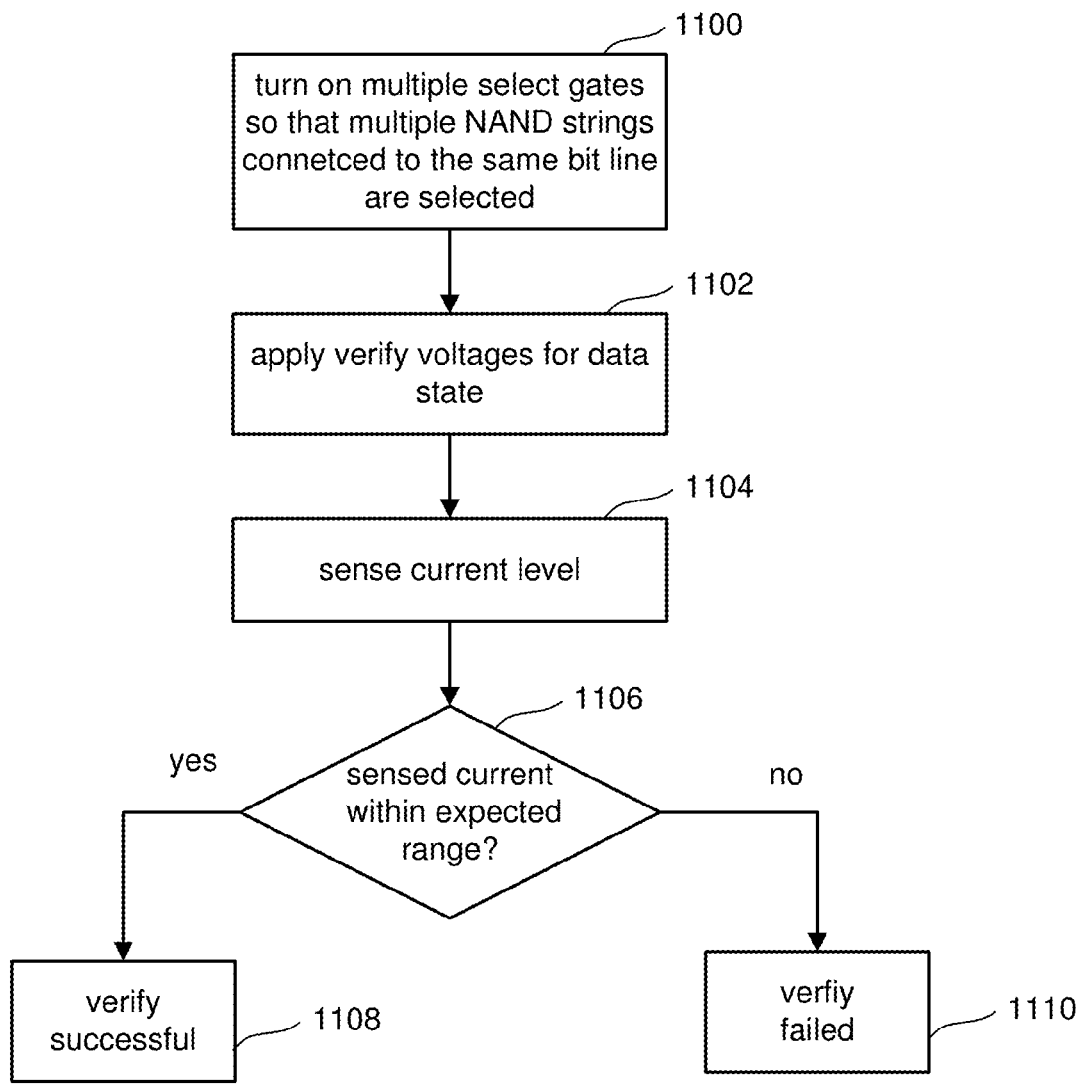
FIG. 13 is a flow chart describing one embodiment of a process for verifying programming.

FIG. 13 is a flowchart describing one embodiment of a process for concurrently verifying the programming for all (or a subset) of the multiple memory cells connected to the same physical word line and the same bit line. For example, looking back at FIG. 4F, memory cells 494*a*, 494*b*, 494*c* and 494*d* can be verified at the same time. In step 1100, the system turns on multiple select gates to connect multiple NAND strings to the same bit line. For example, all four drain side select lines SGD0, SGD1, SGD2, and SGD3 of FIG. 4F are selected. In step 1102, the appropriate verify voltages for the data state being verified are applied to the bit lines and word lines. In step 1104, the sense amplifier circuit connected to the bit line will sense the current through the bit line. If all four memory cells were correctly and completely programmed to the pseudo data pattern, then the current running through each of the memory cells would be known in advance and, therefore, the sum of the four currents that is experienced in the bit line would also be known. Because there are variations in manufacturing process, structure, etc., rather than a single current value being known, the system will have a range of expected current values for properly programmed memory cells. If the sense current is within the expected range (step 1106), then the verification is successful (step 1108). If the sense current is not within the expected range (step 1106), then the verification failed (step 1110). When verify fails, another iteration of the programming process will be performed, as the process of FIG. 13 is performed within step 774 of FIG. 6B.

In one embodiment, the processes of FIGS. 12 and 13 are performed by the one or more control circuits mentioned above. In some implementations, the processes of FIGS. 12 and 13 are performed at the direction of the state machine.

Figure 14:
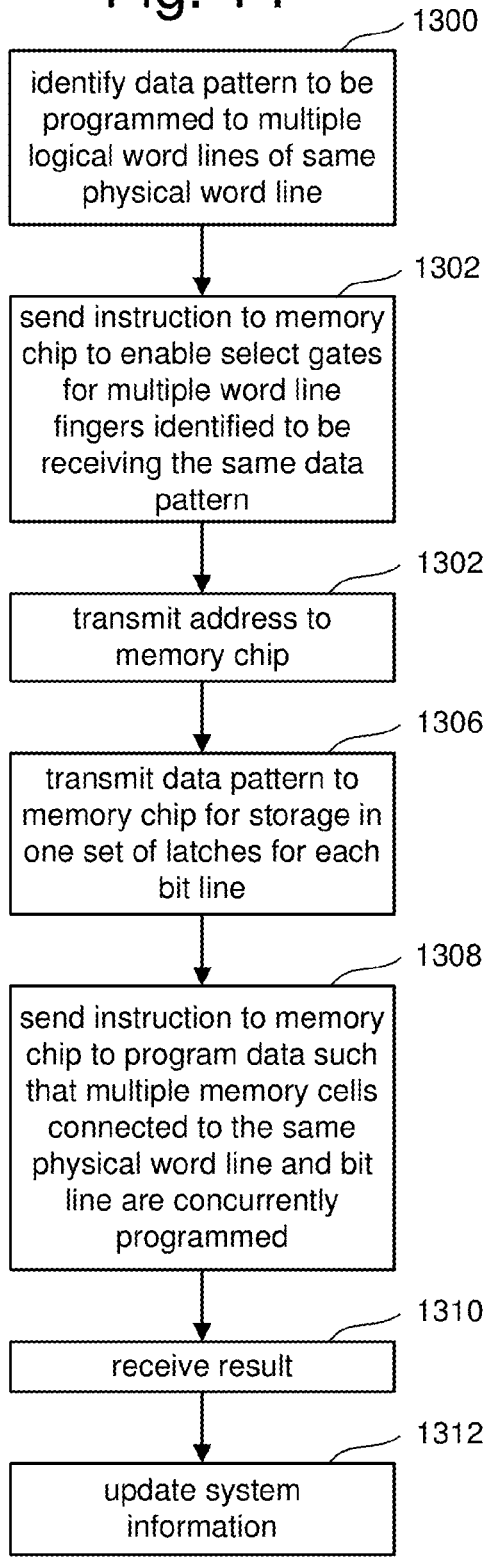
FIG. 14 is a flow chart describing one embodiment of a process for programming.
Figure 15:
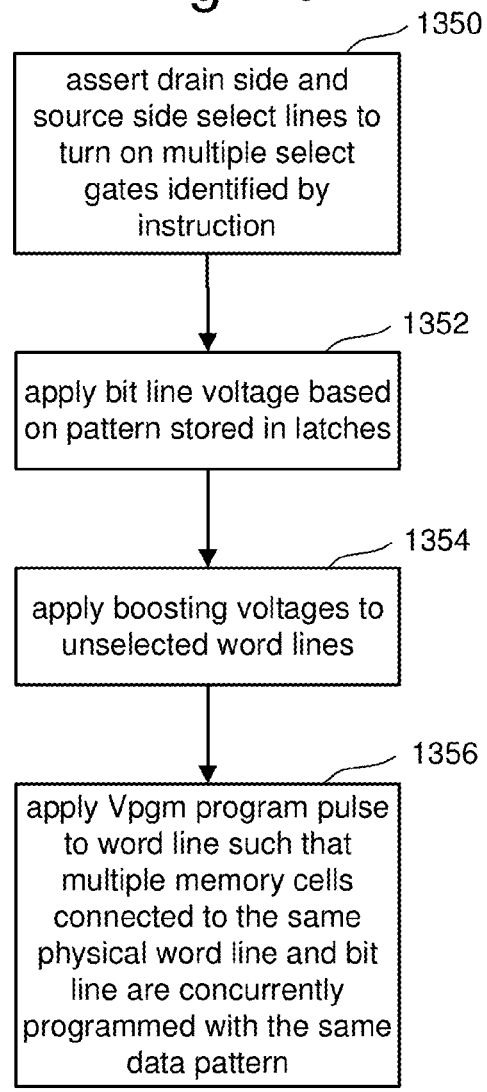
FIG. 15 is a flow chart describing one embodiment of a process for applying a program pulse and other programming voltages.

The above discussion with respect to FIGS. 10 and 11 assumes that the system is padding open word lines with pseudo data. However the concurrent programming technology discussed herein could also be applied to real user data. For example, if two memory cells on two different NAND strings connected to the same bit line and same physical word line, but different logical word lines, are being programmed with the same data state then the technology described herein can be used to program those memory cells concurrently. FIGS. 14 and 15 are flowcharts describing one embodiment for concurrently programming memory cells connected to the same physical word line and same bit line with real user data. Specifically, the flow chart of FIG. 14 describes a process performed by Controller 122 to manage the programming process. The process of FIG. 14 can be performed one or more times for each physical word line. In response to the process of FIG. 14, memory chip 108 will perform the process of FIG. 6B. Step 772 of FIG. 6B includes applying a programming pulse and other programming voltages. FIG. 15 is a flowchart describing one embodiment of a process to implement step 772 of FIG. 6B in response to Controller performing the process of FIG. 14. In one embodiment, the process of FIG. 15 is performed by the one or more control circuits referred to above. In one example implementation, the process of FIG. 15 is performed at the direction of state machine 112.

In step 1300 of FIG. 14, Controller 122 identifies a data pattern to be programmed to multiple logical word lines of the same physical word line. In step 1302, Controller 122 sends instructions to the memory chip 108 to enable multiple select gates for the multiple word line fingers/multiple logical word lines identified to be receiving the same data pattern. In step 1302, Controller 122 transmit the address of the block and physical word line to memory chip 108. In step 1306, Controller 122 transmits the data pattern to the memory chip for storage in the appropriate set of data latches 174 for the appropriate one or more bit lines. In step 1308, Controller 122 sends instructions to the memory chip to program the data such that multiple memory cells connected to the same physical word line and same bit line are simultaneously programmed In step 1310, memory chip 108 reports results and those results are received by Controller 122. In step 1312, Controller 122 updates its system information. In an overall process for programming a large set of data, the process of FIG. 14 can be performed multiple times.

As discussed above, FIG. 15 is one example embodiment of step 772 of FIG. 6B and is performed in response to Controller 122 (or another circuit) performing the process of FIG. 14. In step 1350 of FIG. 15, the memory chip asserts the drain side select lines and source side select lines in order to turn on the multiple select gates identified by the instructions from in step 1302. In step 1352, the appropriate bit line voltages are applied on the selected bit lines based on the data patterns stored in the latches. In step 1354, the appropriate boosting voltages are applied to the unselected word lines, as described above. In step 1356, the system applies the program pulse (Vpgm) to the selected physical word line such that multiple memory cells connected to the same physical word line and the same bit line are concurrently programmed with the same data pattern from the same data latches.

The processes of FIGS. 14 and 15 are performed when the same data is to be programmed to two memory cells connected to the same bit line and same word line. However, when that case happens, there is also other data which can be programmed previously or subsequently that is not repeating such that it cannot be concurrently programmed. Therefore Controller 122 will have to manage a programming process that includes concurrently programming memory cells connected to the same bit line and word line at some points during the programming process and separately programming memory cells connected to the same word line and bit line at other points (previously or subsequently) in the programming process. This hybrid-type process is described by the flowchart of FIG. 16.

Figure 16:
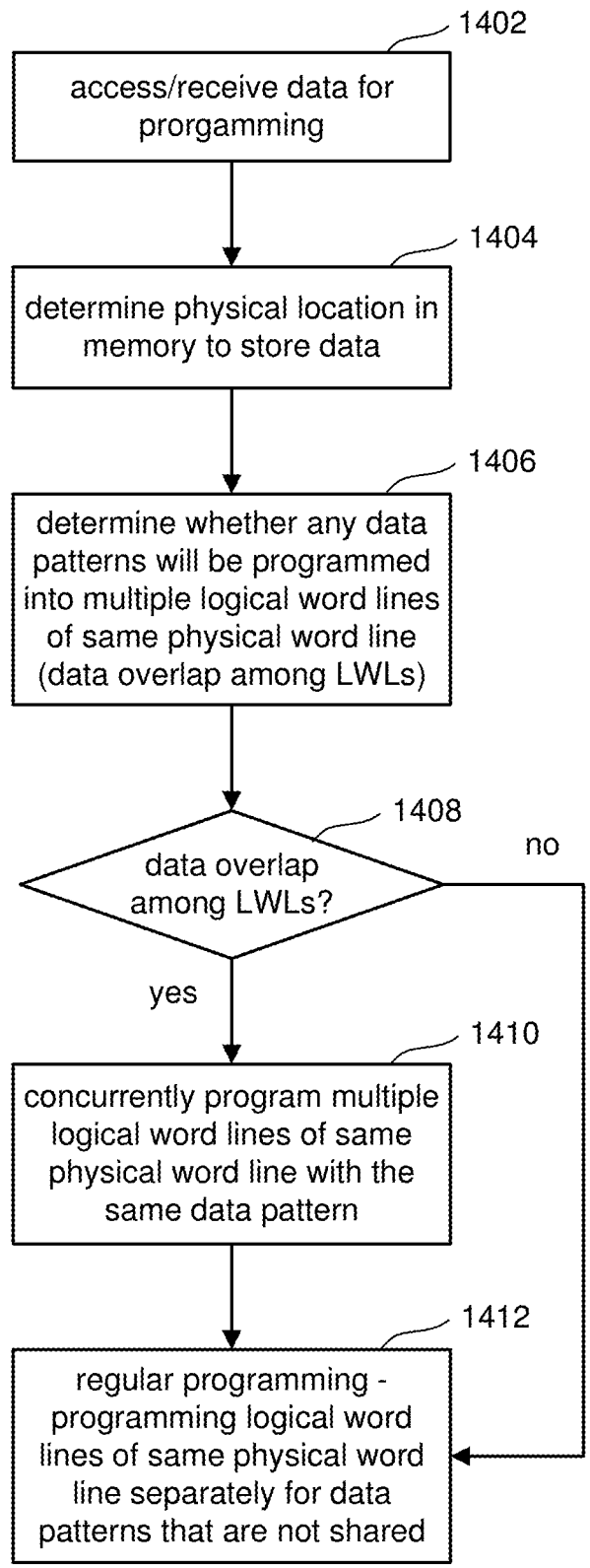
FIG. 16 is a flow chart describing one embodiment of a process for programming

In step 1402 of FIG. 16, Controller 122 accesses and/or receives data for programming In step 1404, Controller 122 determines the physical location in the memory to store that data. For example, Controller 122 may identify a block to program and one or more physical word lines. In step 1406, Controller 122 determines whether any data patterns will be programmed into multiple logical word lines of the same physical word line (data overlap among logical word lines). If there is data that overlaps among logical word lines (step 1408) then in step 1410 Controller 122 concurrently programs multiple memory cells on different logical word lines of the same physical word line with the same data pattern. That is, multiple memory cells connected to the same bit line and the same physical word line (on different logical word lines) will be concurrently programmed. As mentioned above, in one embodiment, the different logical word lines are connected together. One example implementation of step 1410 is the process of FIGS. 14 and 15. After concurrently programming memory cells to receive the same data in step 1410, the system will perform regular programming in step 1412. That is, step 1412 includes the regular programming process where logical word lines of the same physical word line are programmed separately. If, in step 1408, the system determines that there is no data that overlaps among logical word lines of the same physical word line, then step 1410 is skipped and the process will move from step 1408 directly to step 1412.

FIGS. 10/11 and 15/16 are examples of concurrently programming multiple memory cells connected to the same bit line and the word line and/or concurrently programming a plurality of NAND strings via a single physical word line. However, the disclosed technology can be used with other variations of those processes in order to concurrently program memory cells and/or NAND strings.

One embodiment includes a method comprising: simultaneously programming a plurality of non-volatile memory cells connected to a common bit line and a common word line.

One embodiment includes an apparatus, comprising: a bit line; a word line; multiple non-volatile memory cells connected to both the bit line and the word line; and one or more control circuits connected to the memory cells, the one or more control circuits are configured to concurrently program the multiple memory cells connected to both the bit line and the word line.

One embodiment includes an apparatus, comprising: a memory interface circuit configured to communicate with a managing circuit for a three dimensional array of non-volatile memory cells; and a control circuit connected to the memory interface circuit, the control circuit is configured to instruct the managing circuit to enable select gates for multiple memory cells connected to both of a pair of control lines, the select gates connect the memory cells to a first control line of the pair of control lines, the control circuit is configured to transmit common data to the managing circuit for programming of the multiple memory cells, the control circuit is configured to transmit a command to the managing circuit to concurrently program the multiple memory cells with the common data.

One embodiment includes an apparatus, comprising: a bit line; a physical word line; a plurality of NAND strings connected to the bit line and the physical word line, the NAND strings are part of a three dimensional memory structure; and means for concurrently programming the plurality of NAND strings via the physical word line.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
a bit line;
a word line;
multiple non-volatile memory cells connected to both the bit line and the word line; and
one or more control circuits connected to the memory cells, the one or more control circuits are configured to concurrently program the multiple memory cells connected to both the bit line and the word line.

2. The apparatus of claim 1, wherein:
the one or more control circuits are configured to concurrently program the multiple memory cells with the same data.

3. The apparatus of claim 2, further comprising:
additional memory cells connected to the bit line and the word line, the one or more control circuits are configured to program the additional memory cells with different data at a different time than programming the multiple memory cells.

4. The apparatus of claim 1, wherein:
the one or more control circuits are configured to concurrently program the multiple memory cells with pseudo data.

5. The apparatus of claim 1, further comprising:
a common data store, the one or more control circuits are configured to concurrently program the multiple memory cells with data stored in the common data store.

6. The apparatus of claim 1, further comprising:
select gates connected to the bit line, the select gates are positioned between the bit line and the multiple memory cells, each memory cell of the multiple memory cells are connected to and access the bit line via a different select gate.

7. The apparatus of claim 1, wherein:
the one or more control circuits are configured to verify the programming separately for each of the multiple memory cells.

8. The apparatus of claim 1, wherein:
the one or more control circuits are configured to concurrently verify the programming for all of the multiple memory cells.

9. The apparatus of claim 1, wherein:
the plurality of non-volatile memory cells are part of a monolithic three dimensional memory structure.

10. An apparatus, comprising:
a bit line;
a word line;
a plurality of non-volatile memory cells arranged as multiple vertical NAND strings that are part of a three dimensional memory structure, the plurality of non-volatile memory cells includes multiple non-volatile memory cells directly connected to the word line, each of the multiple memory cells are in a different NAND string that includes a separate select gate that is directly connected to the bit line and a separate select line such that each of the multiple memory cells are connected to the bit line via a respective separate select gate; and
one or more control circuits connected to the memory cells, the one or more control circuits are configured to concurrently program the multiple memory cells that are directly connected to the word line and connected to the bit line via respective separate select gates.

11. The apparatus of claim 10, wherein:
the multiple NAND strings are part of a block of memory; and
the one or more control circuits are configured to program a portion of the block with real data, the one or more control circuits are configured to pad a remaining portion of the block with pseudo data by the concurrently programming of the multiple memory cells.

12. The apparatus of claim 11, wherein:
the pseudo data is a pattern of all zeroes; and
the one or more control circuits are selected from the group consisting of a controller and a state machine.

13. A method comprising:
simultaneously programming a plurality of non-volatile memory cells connected to a common bit line and a common word line, the simultaneously programming the plurality of memory cells includes simultaneously programming memory cells on different NAND strings that are part of a three dimensional memory array, the different NAND strings are connected to the common bit line and are in a common block.

14. The method of claim 13, wherein:
the simultaneously programming includes loading data into a latch and simultaneously programming the plurality of non-volatile memory cells based on the data in the latch.

15. The method of claim 13, wherein:
the simultaneously programming includes programming pseudo data into the plurality of memory cells.

16. The method of claim 15, further comprising:
programming real data into additional memory cells connected to the common bit line and the common word line subsequent to simultaneously programming.

17. The method of claim 13, further comprising:
simultaneously verifying the plurality of memory cells.

18. The method of claim 13, wherein
the common word line connects to all NAND strings in the common block;
each NAND string includes at least one select gate; and
the simultaneously programming memory cells on different NAND strings includes turning on the at least one select gate for each of the different NAND strings.

19. An apparatus, comprising:
a memory interface circuit configured to communicate with a managing circuit for a three dimensional array of non-volatile memory cells; and
a control circuit connected to the memory interface circuit, the control circuit is configured to instruct the managing circuit to enable select gates for multiple memory cells connected to both of a pair of control lines, the select gates connect the memory cells to a first control line of the pair of control lines, the control circuit is configured to transmit common data to the managing circuit for programming of the multiple memory cells, the control circuit is configured to transmit a command to the managing circuit to concurrently program the multiple memory cells with the common data.

20. The apparatus of claim 19, wherein:
the control circuit is configured to instruct the managing circuit to concurrently verify programming of the multiple memory cells.

21. An apparatus, comprising:
a bit line;
a physical word line;
a plurality of NAND strings connected to the bit line and the physical word line, the NAND strings are part of a three dimensional memory structure; and
means for concurrently programming the plurality of NAND strings via the physical word line.

* * * * *